United States Patent [19]
Ishida et al.

[11] Patent Number: 5,144,449
[45] Date of Patent: Sep. 1, 1992

[54] IMAGE SENSING SYSTEM

[75] Inventors: Tokuji Ishida; Toshio Norita; Jun Hasegawa, all of Osaka, Japan

[73] Assignee: Minolta Camera Kabushiki Kaisha, Osaka, Japan

[21] Appl. No.: 742,558

[22] Filed: Aug. 9, 1991

Related U.S. Application Data

[60] Continuation of Ser. No. 618,998, Jan. 28, 1990, abandoned, which is a division of Ser. No. 437,526, Nov. 16, 1989, Pat. No. 5,010,409, which is a continuation of Ser. No. 141,080, Jan. 5, 1988, Pat. No. 4,905,033.

[30] Foreign Application Priority Data

Jan. 6, 1987 [JP] Japan ................................. 62-950
Mar. 18, 1987 [JP] Japan ............................... 62-63459

[51] Int. Cl.$^5$ ............................................. H04N 3/14
[52] U.S. Cl. ........................... 358/213.26; 358/213.22
[58] Field of Search ....................... 358/213.22, 213.26, 358/223.29, 213.19, 213.15, 909

[56] References Cited

U.S. PATENT DOCUMENTS

| | | | |
|---|---|---|---|
| 4,293,877 | 10/1981 | Tsunekawa et al. | 358/221 |
| 4,315,159 | 2/1982 | Niwa et al. | 250/578 |
| 4,410,258 | 10/1983 | Aoki et al. | 354/25 |
| 4,430,672 | 2/1984 | Berger | 358/213 |
| 4,495,523 | 1/1985 | Ozawa | 358/213.26 |
| 4,551,757 | 11/1985 | Ohkubo et al. | 358/212 |
| 4,608,606 | 8/1986 | Levine | 358/213.26 |
| 4,630,121 | 12/1986 | Suzuki et al. | 358/227 |
| 4,635,126 | 1/1987 | Kinoshita | 358/228 |
| 4,660,955 | 4/1987 | Ishida et al. | 354/408 |
| 4,677,490 | 6/1987 | Levine | 358/213.26 |
| 4,684,993 | 8/1987 | Berger et al. | 358/213.31 |
| 4,721,975 | 1/1988 | Hamada | 354/408 |
| 4,731,656 | 3/1988 | Dischert et al. | 358/213.26 |
| 4,763,154 | 8/1988 | Iguchi et al. | 354/403 |
| 4,827,345 | 5/1989 | Nakagawa et al. | 358/213.27 |
| 4,837,630 | 6/1989 | Ueda | 358/213.26 |
| 4,839,734 | 6/1989 | Takemura | 358/213.22 |
| 4,857,996 | 8/1989 | Hirano et al. | 358/213.26 |
| 4,897,728 | 1/1990 | Yamada | 358/213.22 |
| 4,905,033 | 2/1990 | Ishida et al. | 354/402 |
| 4,972,254 | 11/1990 | Endo et al. | 358/213.22 |
| 5,010,409 | 4/1991 | Ishida et al. | 358/213.19 |

FOREIGN PATENT DOCUMENTS 62-83627 4/1987 Japan .
63-31378 2/1988 Japan .
63-67976 3/1988 Japan .

OTHER PUBLICATIONS

"CCD Linear Image Sensor Incorporating Peripheral Circuits", NEC Giho, vol. 39, No. 10.
"Fujitsu Integrated Circuit MB 8031L, MB 8032L".

Primary Examiner—Stephen Brinich
Attorney, Agent, or Firm—Burns, Doane, Swecker & Mathis

[57] ABSTRACT

An image sensing system comprises photoelectric conversion element array which responds to the light from a subject and produces charges responding to the quantity of incident light, storage parts temporarily storing the charges produced by the array and a shift register which receives and outputs the charges in the storage parts. A first gate is installed between the array and the storage parts and a second gate is installed between the storage parts and the shift register. The storage time of the charges and the like can be controlled by controlling the first and the second gates by a control circuit. Then, when the subject is of high luminance, the charges are stored into the storage parts with the array and storage parts connected intact to each other by putting the first gating means in the ON state, and the completion of integration thereof is performed by putting the first gate in the OFF state. Also, when the subject is of low luminance, storage of charges is performed in the array with the first gate put in the OFF state, and a dark charges produced in the storage parts during that time is discharged before storing the charges of the above-mentioned arrays.

2 Claims, 27 Drawing Sheets

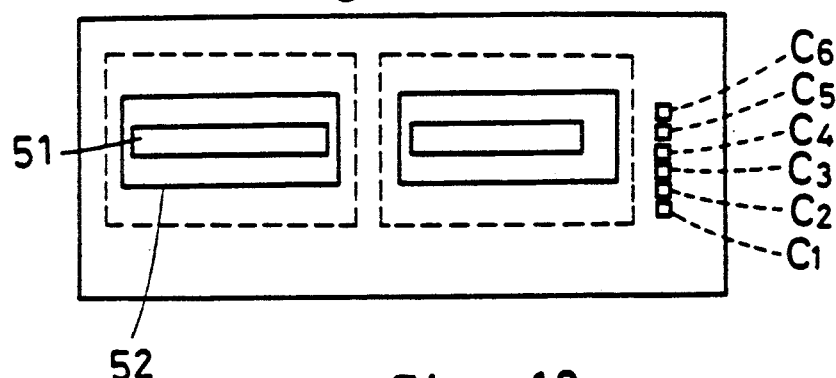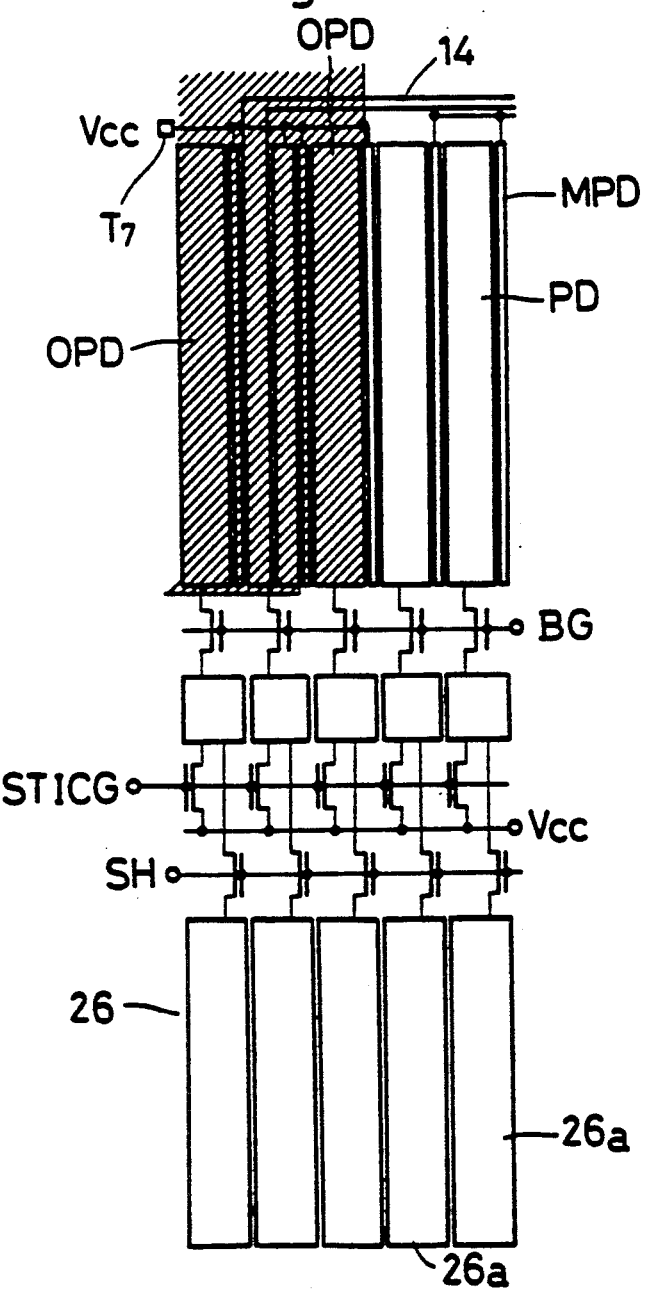

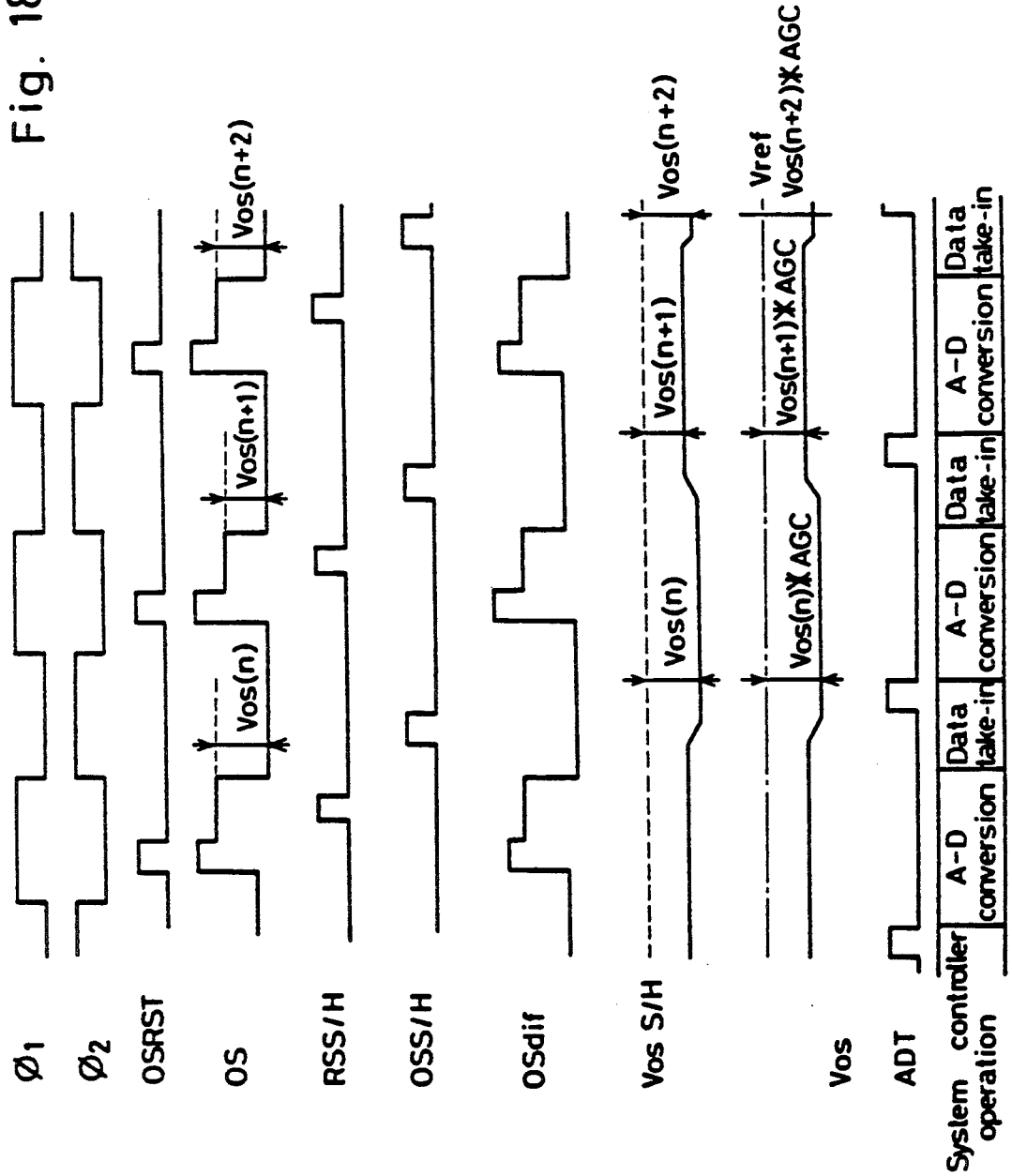

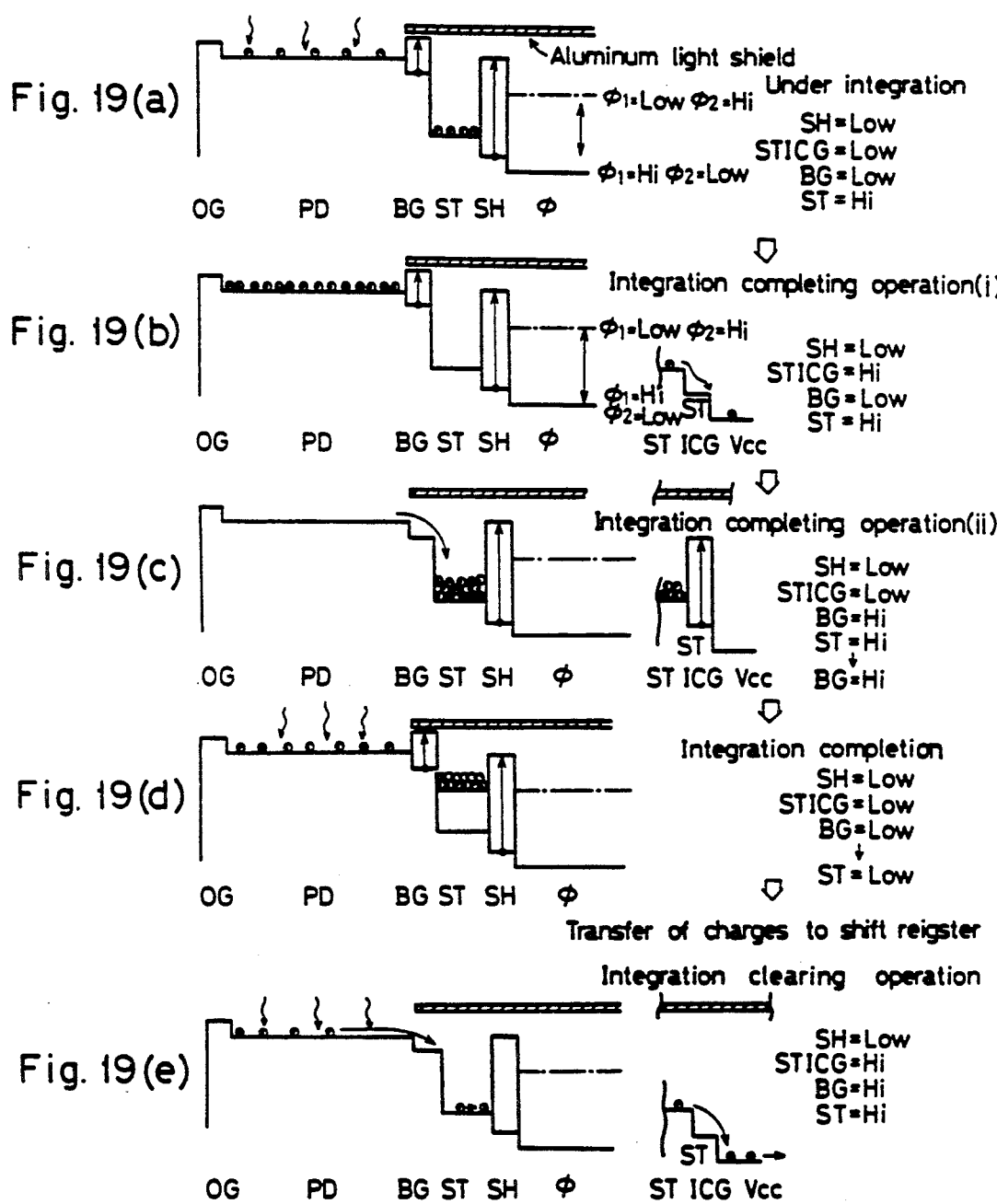

IMAGE SENSING SYSTEM

This application is a continuation of application Ser. No. 07/618,998, filed Nov. 28, 1990, now abandoned, which is a division of Ser. No. 07/437,526, filed Nov. 16, 1989, now U.S. Pat. No. 5,010,409, issued Apr. 23, 1991, which is a continuation of Ser. No. 07/141,080, filed Jan. 5, 1988, now U.S. Pat. No. 4,905,033, issued Jan. 5, 1988.

BACKGROUND OF THE INVENTION

1. Field of the Invention

The present invention relates to an image sensing system, and more specifically relates to an image sensing system wherein a plurality of electric signals responding to the quantity of incident light on a plurality of picture elements provided in photoelectric conversion elements array are once stored in storage parts and are sequentially outputted by a shift register.

2. Description of the Prior Art

An image sensing system is employed, for example, for automatic focus detecting device of a camera. Such image sensing system is used normally by integrating the quantity of charges responding to the quantity of incident light generated by a photoelectric conversion element array which responds to the light from a subject.

Then, in an image sensing system employed for such an automatic focus detecting device, a higher detecting speed of automatic focusing and a more improved system performance in the case with a subject of low luminance have been required For that reason, efforts are being made to obtain a high sensitivity by expanding the area of photo-reception by larger photoelectric conversion elements or by improving the efficiency of conversion. However, such a measure causes the quantity of generated charges to saturate soon when an object is of high luminance, and therefore the integration time which is to be set in the system is required to be extremely short. Accordingly, a short-time integration controlling method has to be employed.

On the other hand, in the case of low luminance, charges generated by the photoelectric conversion elements array are integrated in the array itself and the charges are transferred to storage parts after completing the integration, but this takes a relatively long integration time, and therefore dark charges are generated in the storage parts in that time, and these charges are added to the charges transferred from the array, and therefore the output of the storage parts has an error.

SUMMARY OF THE INVENTION

Therefore, the object of the present invention is to provide an image sensing system making a short-time integration control possible.

Another object of the present invention is to provide an image sensing system not producing an error due to dark charges.

To be brief, the present invention is of an image sensing system wherein a first gating means is installed between a photoelectric converting means and a storing means, a second gating means is installed between the storing means and a shift register, and these gating means are controlled by a control circuit, thereby the control of integrating operation being performed suitably. Accordingly, in accordance with the present invention, in the case with high luminance, charges can be stored in the storage part with the photoelectric converting means and the storage part connected intact to each other by putting the first gating means in the ON state, and the integration is completed only by putting the first gating means, and as a whole, a short-time integration can be realized. Also, in accordance with the present invention, in the case with low luminance, storage of charges is performed only in the photoelectric conversion part in the OFF state of the first gating means, and the storage can be made separately from dark charges generated in the storage part in that time, and the above-mentioned dark charges are discharged in advance as an unnecessary signal at the end of integration, and thereafter charges in the photoelectric conversion part are transferred to the storage part, and thereby effect of the dark charges of the storage part can be eliminated, resulting in an improvement in reliability.

Such an image sensing system in accordance with the present invention is configured with a first photoelectric converting means consisting of a plurality of photoelectric conversion elements outputting an electric signal responding to the intensity of incident light, a first storing means having a plurality of storage parts respectively outputting the electric signal from the first photoelectric converting means, a first gating means consisting of a plurality of gates connected between the photoelectric converting means and the first storing means, a shift register means which receives the electric signal stored in the first storing means and sequentially outputs this signal at a timing responding to a predetermined clock signal, a second gating means consisting of a plurality of gates connected between the first storing means and the shift register means, and a controlling means controlling the first gating means and the second gating means so as to activate the first gating means and deactivate the second gating means in response to a predetermined storage start signal to store the electric signal outputted by the first photoelectric converting means in the first storing means and deactivate the first gating means in response to a predetermined storage end signal and thereafter activate the second gating means in an instant pulse fashion to transfer the electric signal stored in the first storing means to the shift register means.

In addition, a controlling means may be configured as follows.

A controlling means deactivates the first gating means and second gating means in response to a predetermined storage start signal to hold an electric signal by the first photoelectric converting means, and first activates the first gating means in a pulse fashion in response to a predetermined storage end signal to store the electric signal held in the first photoelectric converting means in the first storing means, and thereafter activates the second gating means in a pulse fashion to transfer the electric signal stored in the first storing means to the above-mentioned shift register.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 12 is a view showing a schematic shape of the photo-conversion part of the system in accordance with the present invention when viewed from the incident light side.

FIG. 13 is a view of another embodiment corresponding to FIG. 8.

FIG. 18 is a diagram of waveforms of various signals for explaining operation of an analog processing part in FIG. 14.

FIGS. 19a-c and FIGS. 20a-c are views showing physical operations of the photoelectric conversion part in the low luminance integration mode and in the high luminance integration mode, respectively.

DETAILED DESCRIPTION OF THE PREFERRED EMBODIMENT

Figure 1:
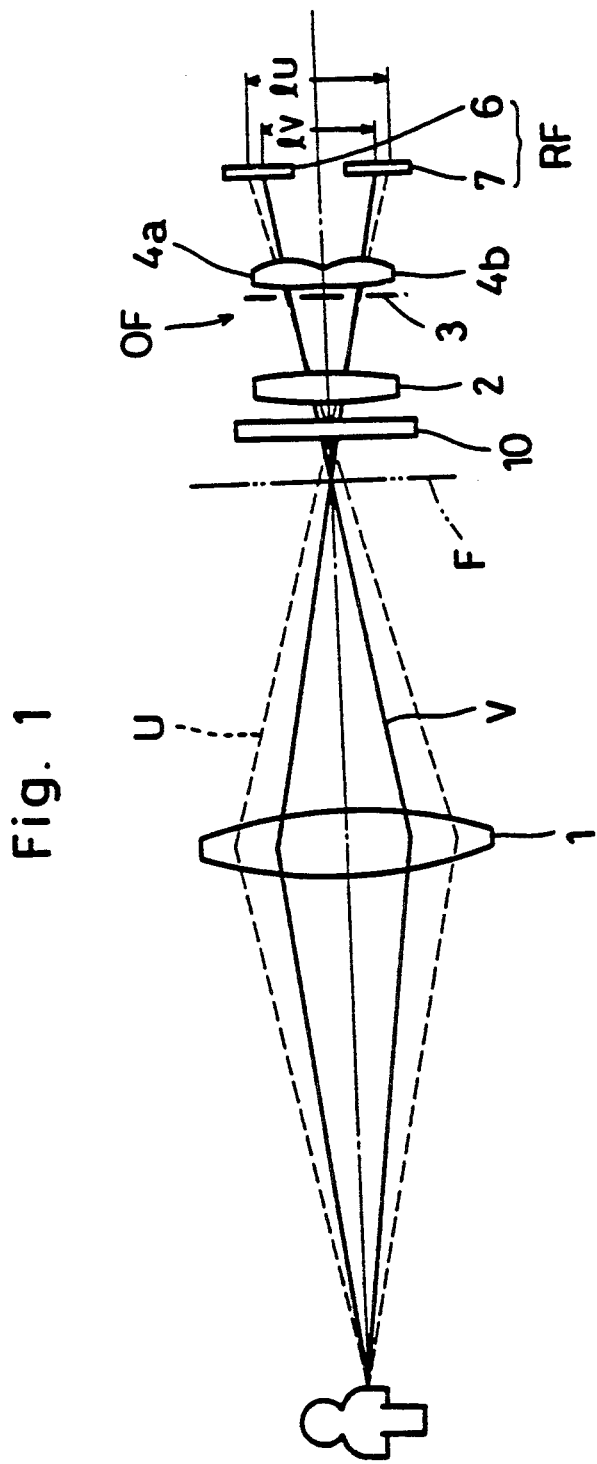
FIG. 1 is a principle view of an optical system in the case where an image sensing system in accordance with the present invention is employed for detecting the focusing condition of a camera.

As shown in FIG. 1, a focusing condition detecting optical system OF constituting a focus detecting apparatus for a camera is constituted with an infrared ray cutting filter 10 and a condenser lens 2 which are installed behind a predetermined focal plane F behind a photographing lens 1, a pair of image re-forming lenses 4a and 4b positioned further behind whereto an aperture mask 3 is disposed, and major parts 6 and 7 of photo sensor arrays for AF (automatic focusing) as a constituent of a light receiving part for focusing condition detection RF having charge coupled devices CCD installed on image re-forming planes of the image re-forming lenses 4a and 4b.

In the case where for the above-mentioned photo sensor array, the one having a relatively flat spectral sensitivity within visible light V, for example, silicon is used, the image forming point of a long-wavelength component U in visible light, for example, $\lambda = 720$ nm by the photographing lens 1 is located behind the predetermined focal surface F due to the axial chromatic aberration of the photographing lens 1, and therefore generally an image interval $l_u$ (equivalent to a focusing position detection signal) corresponding to the subject containing a large amount of reflected light of such a component becomes larger than an image interval $l_v$ corresponding to the subject containing a large amount of reflected light component of visible light (center $\lambda = 560$ nm).

Figure 2:
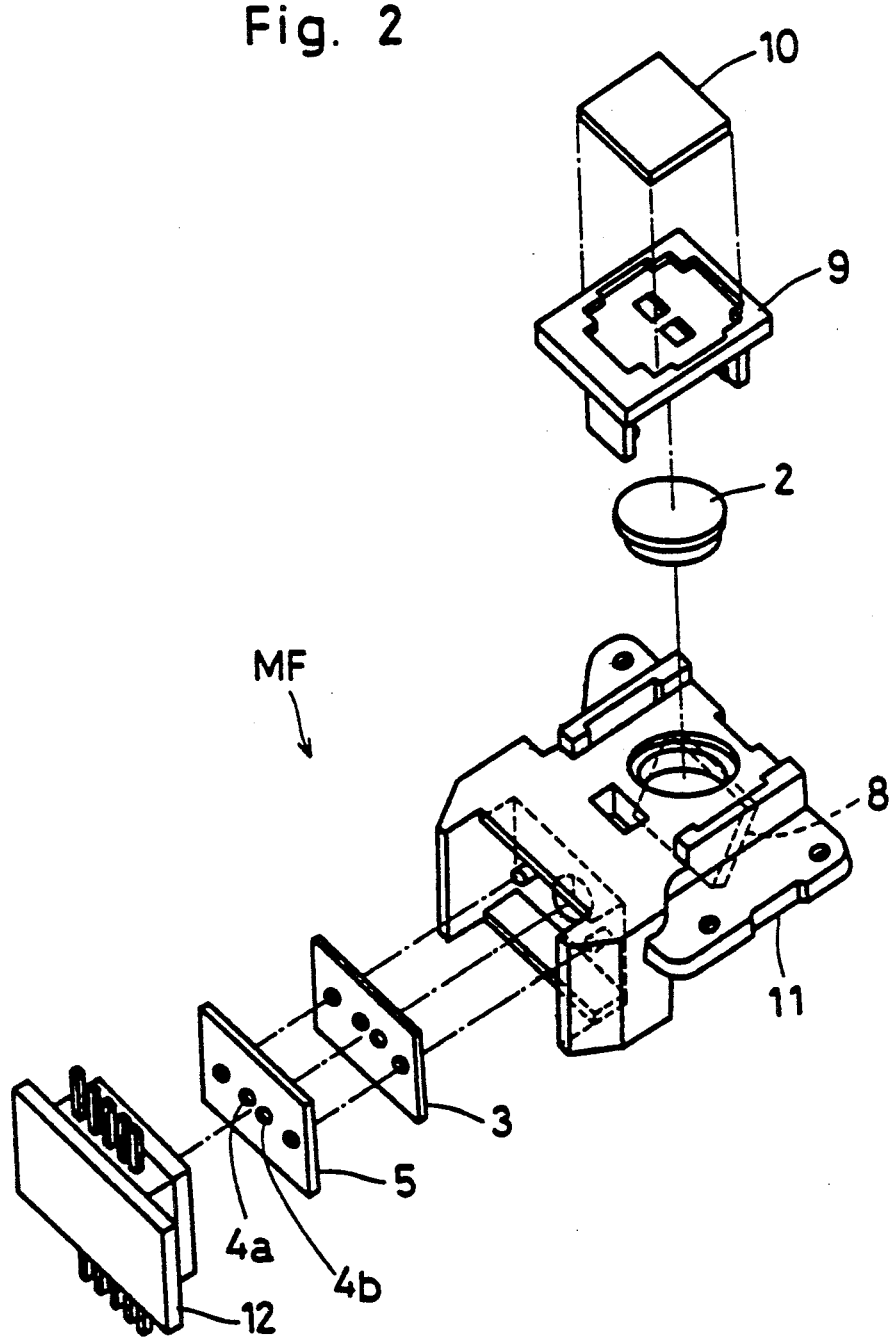
FIG. 2 is an exploded perspective view of a sensor module of the same system.

FIG. 2 shows a construction of an AF sensor module MF wherein the above-described detecting apparatus is formed in a one-piece fashion. This AF sensor module MF incorporates an optical path converting mirror 8, and above this mirror the above-described condenser lens 2, a field mask 9 and the infrared light cutting filter 10 cutting infrared light having wavelengths longer than nearly 750 nm are disposed.

Here, the infrared light cutting filter 10 not only suppresses adverse effect of chromatic aberration to a minimum limit by eliminating unnecessary infrared light, but also prevents deterioration of reliability of focusing signal due to increase in scattering of photo sensitivity of each picture element t incident light having long wavelength component.

Then, the apparatus has a basic structure wherein each of these constituents are supported by a lens holder 11, and also the aperture mask 3, a substrate 5 having a pair of image re-forming lenses 4a and 4b and a photoelectric transducer 12 incorporating the above-described photo-sensor arrays are supported perpendicularly to the optic axis converted by the optical path converting mirror 8.

Figure 3:
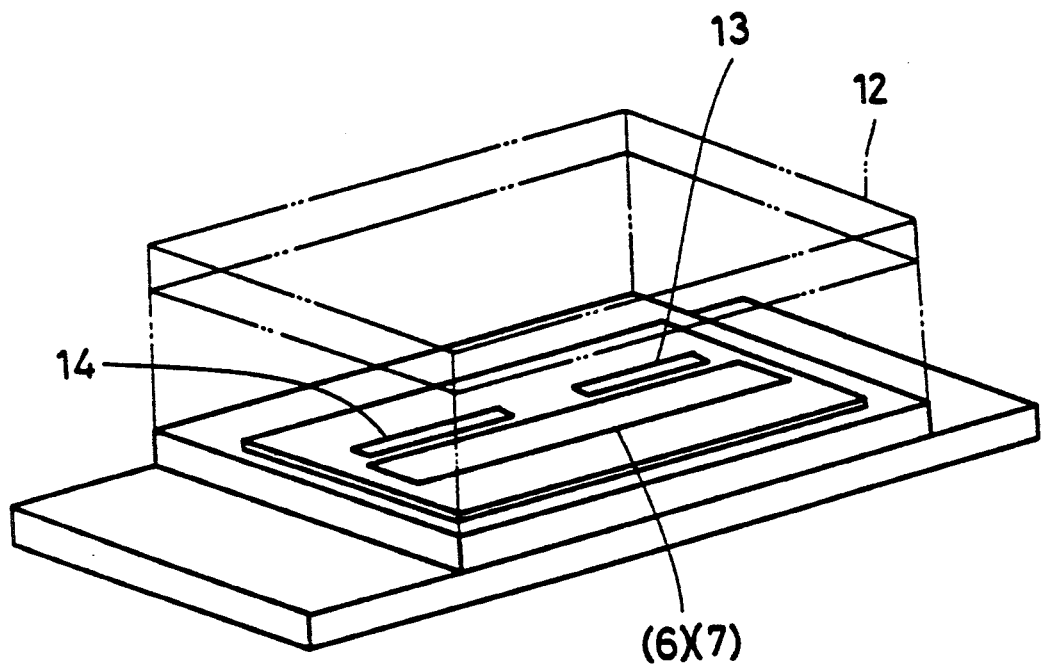
FIG. 3 is a schematic configuration view of an photoelectric transducer of the same system.

FIG. 3 shows a configuration of the photoelectric transducer 12 in the AF sensor module MF.

In the photoelectric transducer 12, a pair of photo diodes 13 and 14 for detecting color temperature are arranged adjacently to and nearly in parallel to the photo sensor arrays for constituting the focusing condition detecting photo detector part RF (in FIG. 3, the major parts 6 and 7 of two photo sensor arrays as shown in the principle view in FIG. 1 are shown as a single continuous piece). Then, an image of the subject is formed on the photo sensor arrays and the color temperature detecting photo diodes 13 and 14 by the two image re-forming lenses 4a and 4b.

Figure 4:
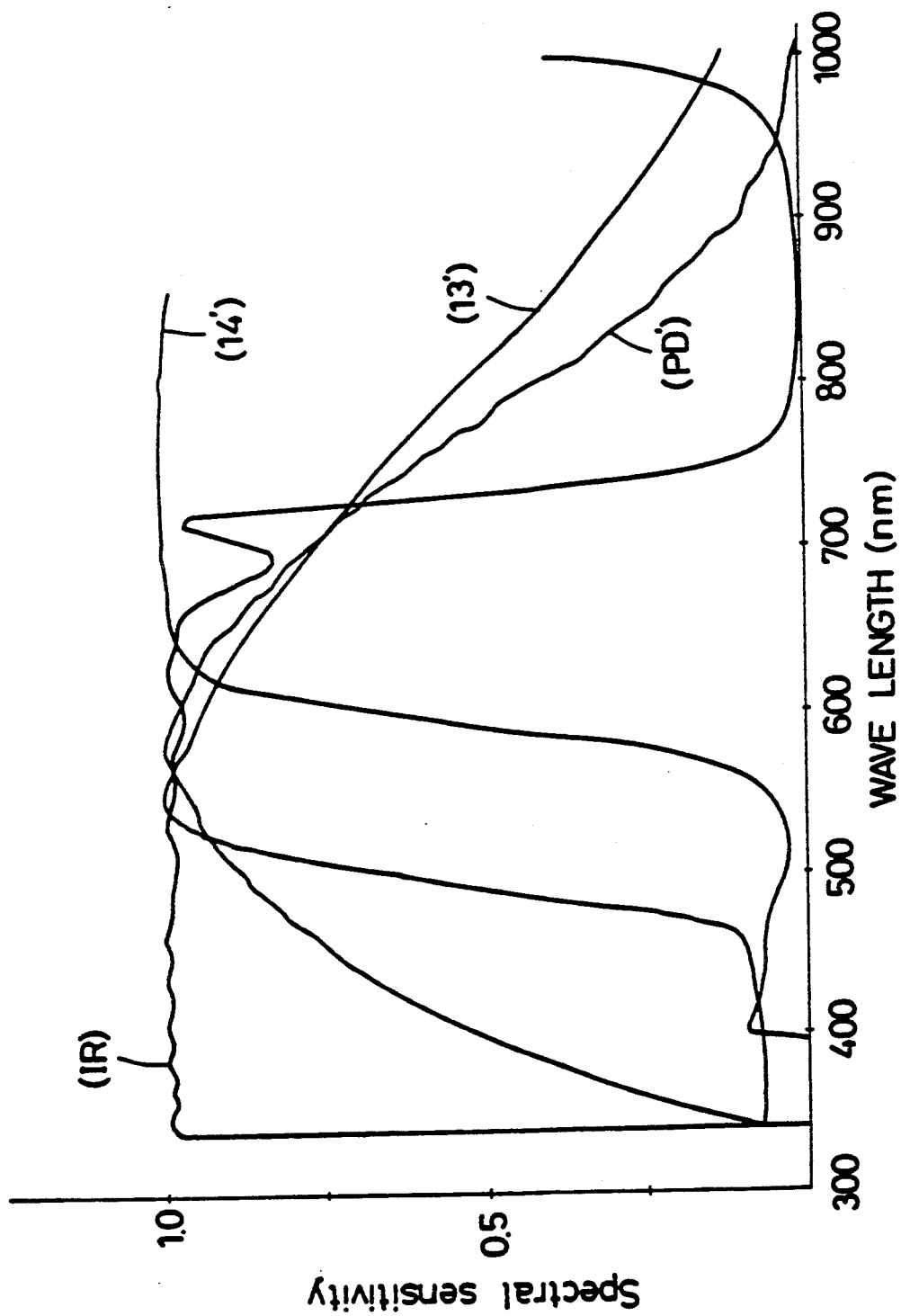
FIG. 4 and FIG. 5 are characteristic graphs for explaining the spectral sensitivity of a photo-diode of the same for detecting color temperature.

FIG. 4 shows spectral sensitivity characteristics of photo diodes PD' constituting the color temperature detecting photo diodes 13 and 14 and the pigment filter disposed thereon with the abscissa taken as wavelength and the ordinate as relative spectral sensitivity. Here, numerals 13' and 14' designate spectral characteristics of the yellow pigment filter and the red pigment filter, respectively. Accordingly, the spectral sensitivity characteristics of the color temperature detecting photo diodes 13 and 14 are PD's multiplied by 13' and 14' in FIG. 4, respectively.

The above-mentioned color temperature detecting photo diodes see nearly the same subject through separate image re-forming lenses, respectively.

Figure 5:
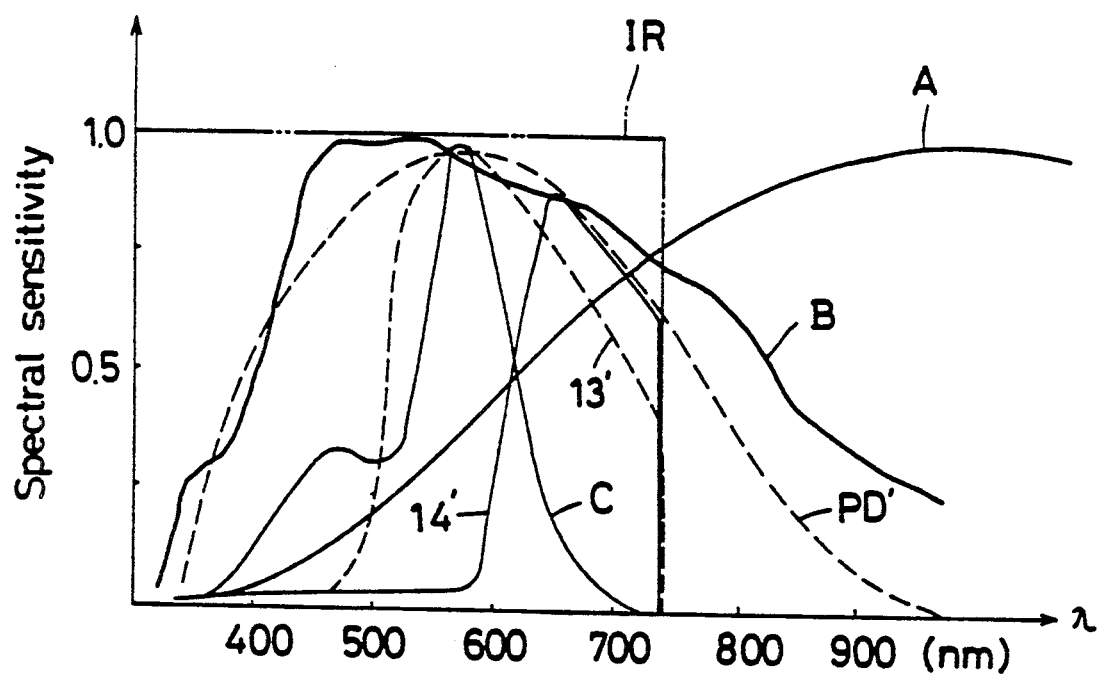

FIG. 5 is a graph where the above characteristics are depicted along with spectral energy distribution of light from various light sources. The abscissa represents wavelength and the ordinate represents relative spectral sensitivity or energy.

Curves A, B and C in the graph show spectral energy distribution of light from a standard light source A such as a tungsten lamp, sun light and light from a white fluorescent lamp, respectively. Also, curves 13', 14' and PD' in the graph are applied correspondingly to FIG. 4.

In addition, a dash-colon line IR at the position of 750 nm shows wavelengths cut by the above-described infrared light cutting filter 10.

Then, as described later, the spectral energy distribution of light measured for detecting focusing condition is detected based on output currents from a pair of color temperature detecting photo diodes 13 and 14 which are the color temperature compensating photo detector parts, specifically based on the ratio thereof.

This means that as obvious from the graph, the difference in outputs from the both photo diodes 13 and 14 appears remarkably in an area of wavelengths longer than about 600 nm, and therefore if the areas of the both are designed to be 1:1, the outputs from the both photo diodes 13 and 14 are nearly the same for the light from the white fluorescent lamp, and the ratio thereof is nearly 1.0. Also, under the light of the standard light source A, light energy becomes remarkable at wavelengths longer than 600 nm, and therefore the ratio of outputs from the both photo diodes 13 and 14 becomes as large as about 2.0. Furthermore, the light energy distribution of infrared light area of sun light falls nearly the middle between the light from the white fluorescent lamp and the light from the standard light source A, and the ratio of the outputs from the both photo diodes 13 and 14 is about 1.5.

Also, the first color temperature detecting photo diode 13 and the second color temperature detecting photo diode 14 are installed on the same chip adjacently to a standard part and a reference part of the photo diode arrays as described later, and see nearly the same subject as those of the standard part and the reference part.

Figure 6:
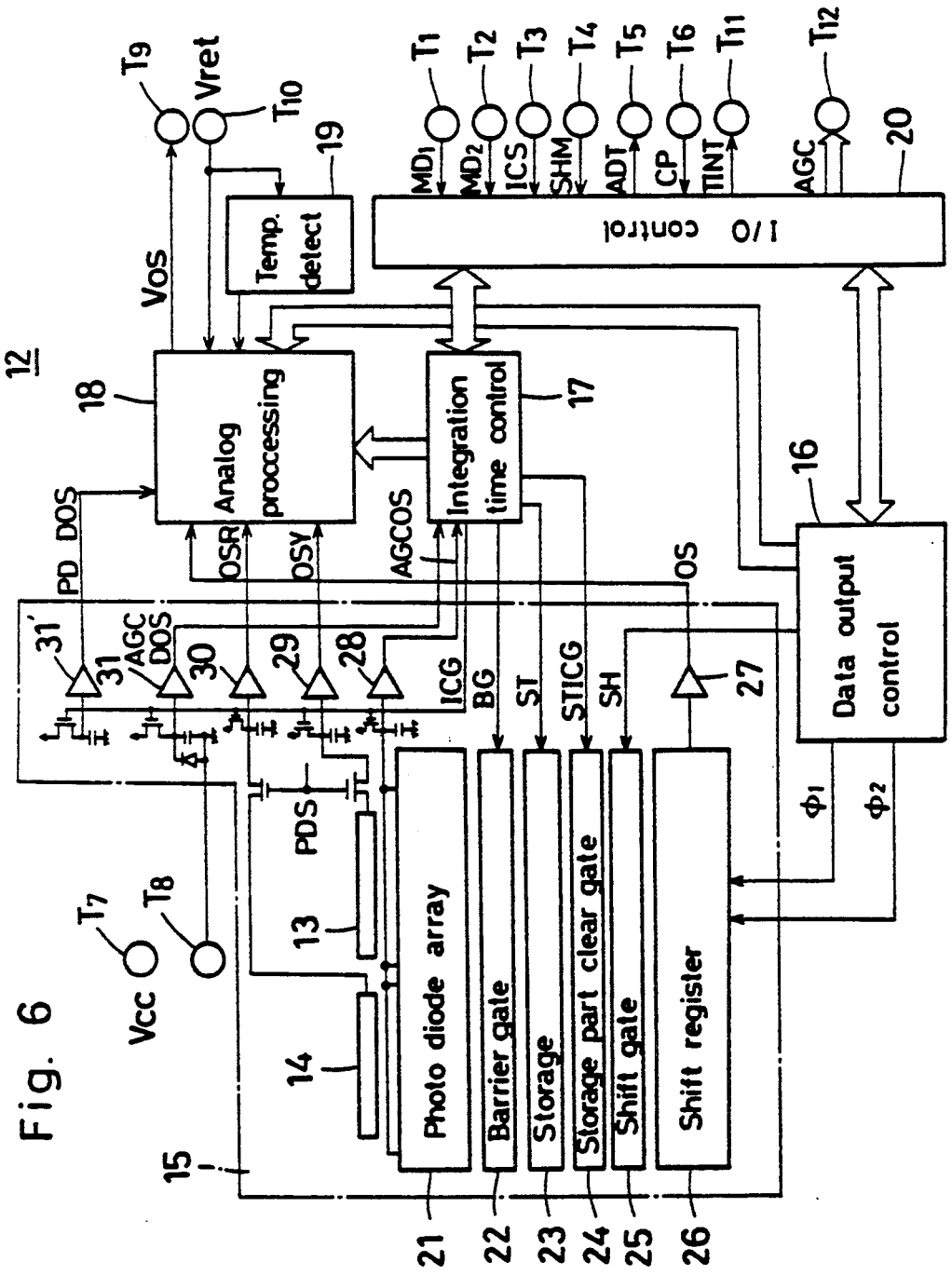
FIG. 6 is a block circuit diagram of the photoelectric transducer in the system embodying the present invention.

Next, description is made on a configuration of the above-mentioned photoelectric transducer in reference to FIG. 6 through FIG. 13. First, as shown in FIG. 6, the photoelectric transducer 12 is constituted with a photoelectric conversion part 15 having photo diodes generating photo charges responding to the quantity of irradiated light, a shift register and the like, a data output control part 16 performing charge transfer from the photo diode side to the shift register side, control of charge transfer in the shift register and control of signal processing timing of an analog processing part as described later, an integration time control part 17 controlling integration time and the like of the above-mentioned photoelectric conversion part 15, an analog processing part 18 processing an analog signal from the photoelectric conversion part 15, a temperature detecting part 19 for supplying temperature information to a system controller as described later in response to a temperature change, and an I/O control part 20. Then, this photoelectric transducer 12 is formed as one chip IC wherein the above-mentioned each constituent is installed on one substrate.

The photoelectric conversion part 15 is constituted with main elements of a pair of color temperature detecting photo diodes 13 and 14 as described above, a photo diode array part 21, a barrier gate 22, a storage part 23 temporarily storing charges, a storage part clear gate 24, a shift gate 25 and a shift register 26, and also comprises respective output buffers thereof, that is, an output buffer 27 of the shift register 26, an output buffer 28 for a monitoring photo diode MPD located between a plurality of picture elements in the photo diode array as described later, output buffers 29 and 30 of the color temperature detecting photo diodes 13 and 14, an buffer 31 for outputting a monitor output compensating signal for dark-compensating the output of the monitoring photo diode MPD and a buffer 31' for standard voltage for color temperature detection signals OSY and OSR.

Figure 7:
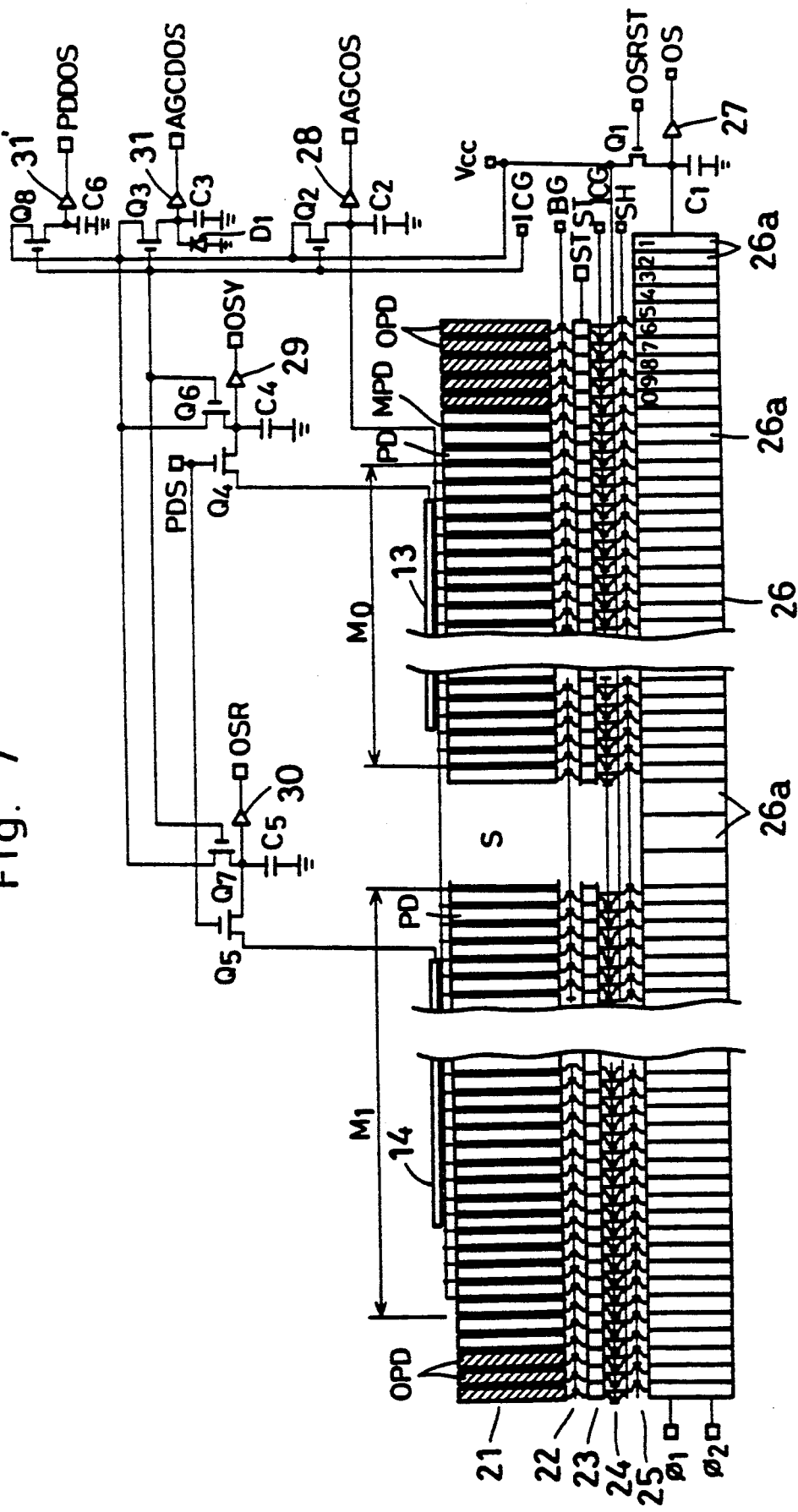
FIG. 7 is a view showing a circuit configuration of a photoelectric conversion part of the same.

Furthermore, capacitors and switching transistors are installed between the color temperature detecting photo diodes 13 and 14 and the buffers 29 and 30, and between the monitoring photo diode MPD and the buffer 28, and further at the prestages of the buffers 31 and 31' respectively, and description on these capacitors and transistors will be added to description on the specific circuit configuration of the photoelectric conversion part 15 as shown in FIG. 7. The data output control part 16 is constituted with a signal processing timing generating part and a transfer clock generating part, and produces transfer clocks $\phi_1$ and $\phi_2$ for driving the shift register based on a signal given from a system controller as described later through the I/O control part 20, and also generates a shift gate pulse SH to the shift gate 25. Also, it gives a sampling signal and a signal serving to form a timing signal for switching-over of a signal outputted outward from the photoelectric transducer 12.

The integration time control part 17 monitors a signal AGCOS given from the monitoring photo diode MPD through the buffer 28, and in response to the result of monitoring, it controls integration time by properly outputting control signals BG, ST and STICG controlling the barrier gate 22, the storage part 23 and the storage part clear gate 24, respectively. In that monitoring, the integration time control part 17 compensates dark component in accordance with the monitor signal AGCOS by a monitor output compensating signal AGCDOS given from the buffer 31. The integration time control part 17 also sends and receives signals to and from the system controller through the I/O control part 20, and among them, an integration end signal TINT is cited as a signal given to the system controller. Furthermore, this integration time control part 17 forcedly completes integration by a command signal SHM from the system controller when the value of integration of the photoelectric conversion part 15 does not reach a predetermined value of integration within a predetermined time, and also generates an automatic gain control signal AGC responding to the value of integration to give it to the analog processing part 18 to compensate the insufficient state of the integration output attending thereon in the stage of analog processing. The analog processing part 18 eliminates noise components from a signal OS from the shift register 26 and the output signals OSY and OSR from the color temperature detecting photo diodes 13 and 14 and performs various analog processing such as dark output signal compensation and automatic gain control as basic functions thereof. In addition, as detailed later, this analog processing part 18 has function for performing standard voltage clamping to match an output signal with a dynamic range of an A/D conversion part of the system controller.

Figure 14:
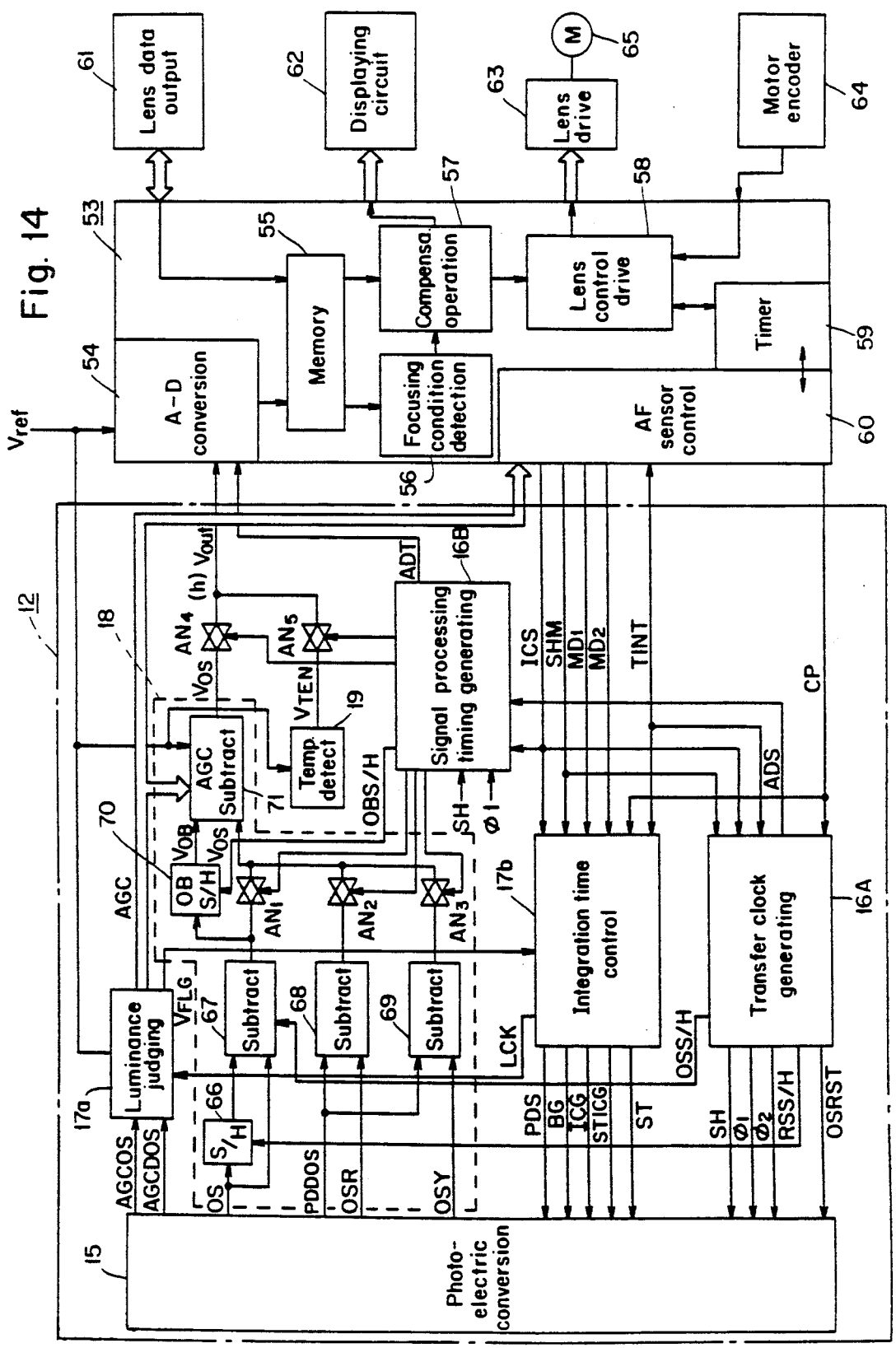
FIG. 14 is a block circuit diagram showing a whole configuration of the image sensing system embodying the present invention.

The I/O control part 20 refers to the input/output buffers which are dispersed respectively in a signal processing timing generating part 16B, an integration time control circuit 17b and a transfer clock generating part 16A as shown in FIG. 14. In FIG. 6, among external terminals $T_1$-$T_6$, $T_{11}$ and $T_{12}$ which are connected to the I/O control part 20, the terminals $T_1$ and $T_2$ are input terminals for receiving mode signals $MD_1$ and $MD_2$ selectively specifying the integration start mode, the low luminance integration mode, the high luminance integration mode and the data dump mode for giving integration output to the system controller, the terminal $T_3$ is an input terminal of an integration clear signal ICS related to integration start, the terminal $T_4$ is a data request terminal for requesting data from the shift register 26 by forcedly completing integration, the terminal $T_5$ is a terminal for outputting an A/D conversion start signal ADT to exterior (system controller) in the data dump mode and the terminal $T_6$ is an input terminal of a basic clock CP. Furthermore, the terminal $T_{11}$ is a terminal outputting the integration end signal TINT, the terminal $T_{12}$ is a group of terminals outputting the data AGC for automatic gain control. Also, the terminals $T_7$ and $T_8$ shown at the position apart from the I/O control part 20 are an input terminals of a power supply Vcc and a grounding terminal, respectively. Also, the terminal $T_9$ is an analog signal output terminal, and the terminal $T_{10}$ is an input terminal of a reference voltage Vref.

Figure 8:
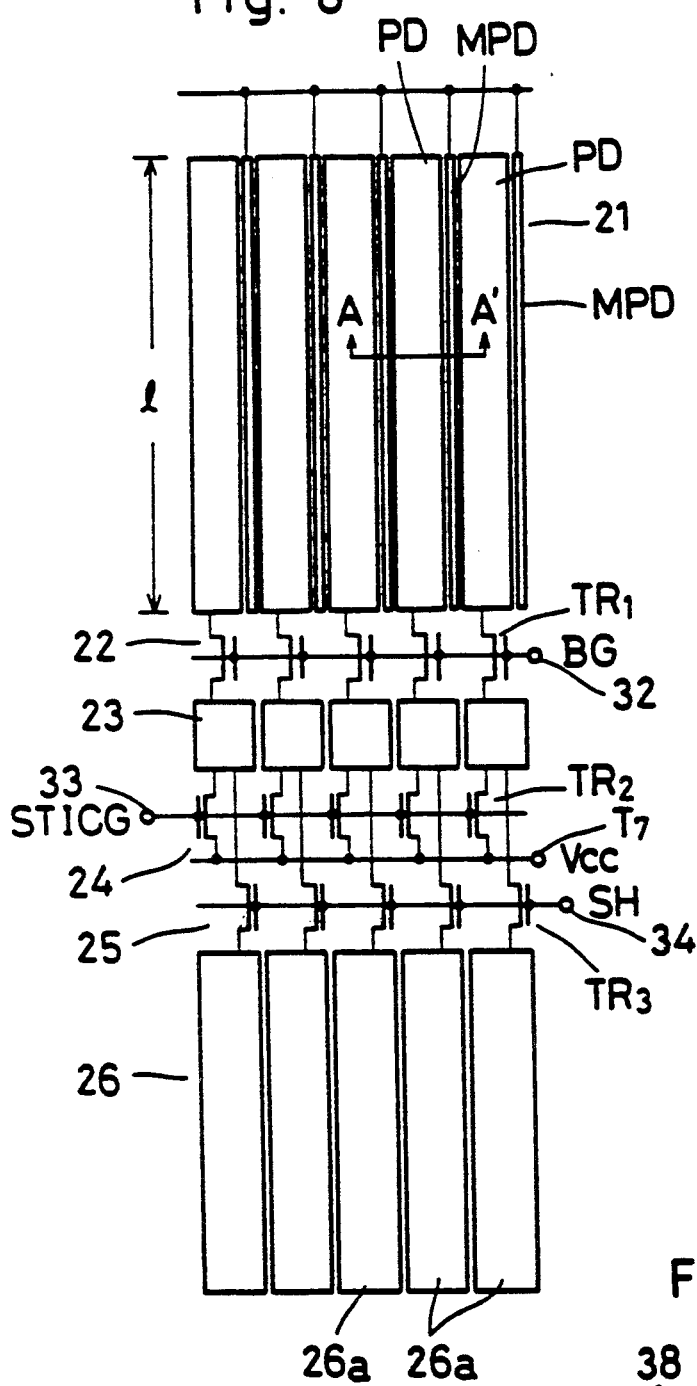
FIG. 8 is a magnified view of a part of FIG. 7.

Next, detailed description is made on a specific configuration of each part of the above-mentioned photoelectric transducer 12. First, the whole of the photoelectric conversion part 15 is configured as shown in FIG. 7, and portions thereof having the main elements such as the photo diodes and the shift register are described in reference to FIG. 8 through FIG. 13. As shown in FIG. 8, the photo diode arrays part 21 is formed in a shape of having a plurality of picture element photo diodes PD and monitoring photo diodes MPD disposed therebetween in an alternate fashion. One end in the longitudinal direction of each picture element photo diode is open, but the other end is connected to the source of a first MOS transistor $TR_1$ forming the barrier gate 22. The drain of this MOS transistor $TR_1$ is connected to the storage part 23 of the next stage, and the gate is connected to a barrier gate signal supply terminal 32. The storage part 23 is shielded from light by an aluminum film, and is not exposed to irradiation of light, but produces dark charges. The output end of the storage part 23 is connected to the source of a second MOS transistor $TR_2$ forming the storage part clear gate 24 and the source of a third MOS transistor $TR_3$ forming the shift gate 25, and the drain of the second MOS transistor $TR_2$ is connected to the power terminal $T_7$ whereto the power supply Vcc is given, and the gate is connected to a storage part clear gate signal supply terminal 33. On the other hand, the drain of the third MOS transistor $TR_3$ is connected to a segment 26a constituting the shift register 26, and the gate is connected to a shift gate signal supply terminal 34.

The monitoring photo diodes MPD are connected to one another by photo diodes at the top end side of the drawing, and accordingly the monitor output is an overall output of a plurality of monitoring photo diodes MPD.

Thus, the connection of a plurality of monitoring photo diodes realizes a subject luminance monitoring photo diode device having a wide range of visual field.

Figure 9:
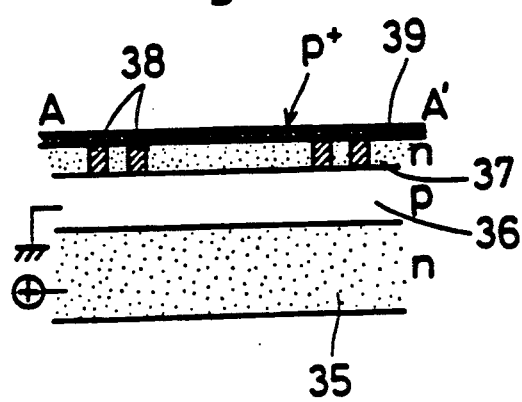
FIG. 9 is a cross-sectional view taken along a line A—A' in FIG. 8.

Summary of the physical structure of the above-mentioned photo diode array part 21 is such that as shown in FIG. 9 showing a cross-section taken along line A—A' in FIG. 8, it consists of a P-type region 36 formed on a silicon substrate 35 by the diffusion method, an n-type region 37 formed by the injection method, a channel stopper 38 composed of P+ applied to the top n-type region to section the picture element photo diodes PD and the monitoring photo diodes MPD, and a P+film 39 which is installed on the surface to suppresses the surface depletion layer. Positive potential is given to the substrate 35 from exterior, and ground potential is given to the intermediate P-type region 36. In addition, the n-type region 37 is formed by phosphorus injection and the P-type region is formed by baron diffusion.

Then, it is known that the time required for transferring charges stored in the above-described picture element photo diodes PD to the storage part 23 through the barrier gate 22 is nearly proportional to square of a length l of the picture element photo diode PD. On the other hand, for the focusing detecting apparatus, it is desirable to increase the quantity of generated charges by increasing the total area of each picture element photo diode PD by increasing the length l so that it can operate even for the subject of considerably low luminance. Here, an increase in width of the picture element photo diode PD is not preferable because it deteriorates the precision of the focusing detecting apparatus.

To meet this conflicting requirement, the present inventors considered to vary the depth of the n-type region 37 beneath the above-described P+film 39 along the longitudinal direction. This means that as the structure of the major part thereof (portion close to the surface) is shown in FIG. 10(c) which is sectioned in the direction shown by a dotted line 40 in a plane configuration view of FIG. 10(a), on forming an n-type region beneath the P+film 39, an n−region 37a and an n region 37b are formed by varying the quantity of injection of phosphorus ions along the longitudinal direction (right-left direction in FIG. 10).

Figure 10A:
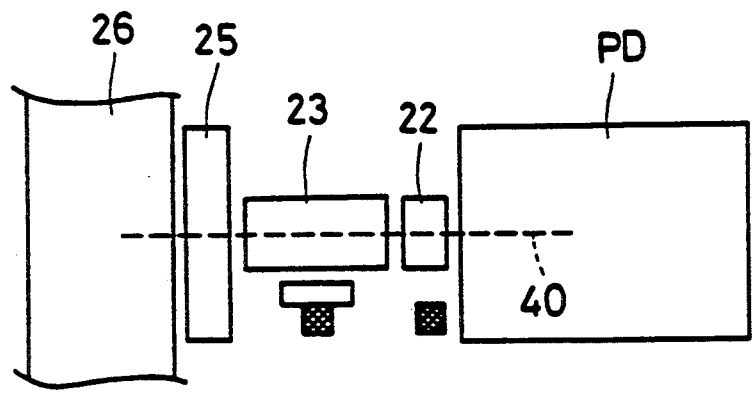
FIGS. 10a-c are a structural view showing a physical structure of a picture element photo-diode used for the system in accordance with the present invention.
Figure 10B:
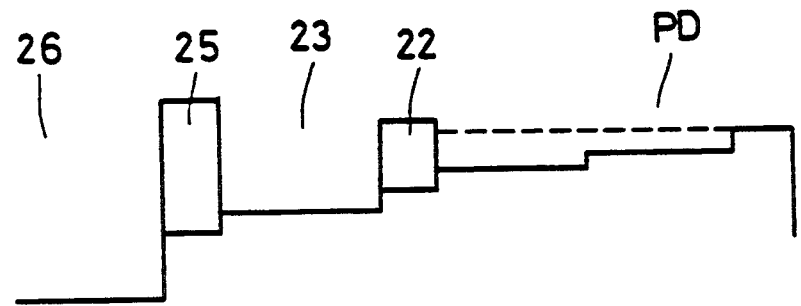
Figure 10C:
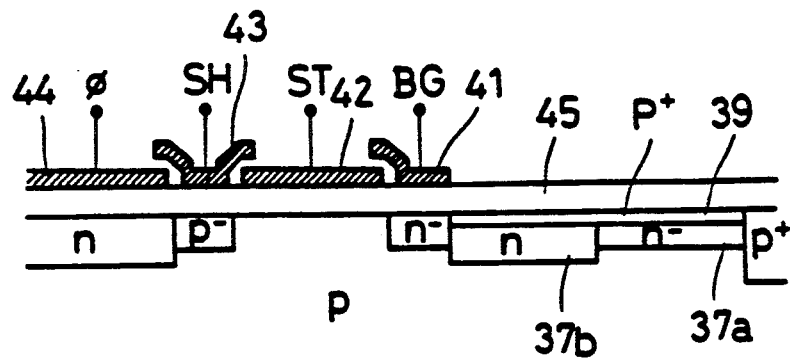

Thus, as shown in FIG. 10(b), the potential of the picture element photo diode PD becomes lower in sequence toward the barrier gate 22, and charges become easy to be transferred in the left direction (barrier gate side). This means that the time required for transferring the charges stored in the picture element photo diode is reduced. Therefore, the task can be solved that charges generated in the photo diode are increased by increasing the length in the longitudinal direction l of the picture element photo diode PD and the generated charges are transferred quickly to the storage part. In addition, in FIG. 10, numerals 41, 42, 43 and 44 designate electrodes of the barrier gate 22, the storage part 23, the shift gate 25 and the shift register 26 respectively, and aluminum material is normally used to form these electrodes. Numeral 45 designates an insulating film formed with $SiO_2$ or the like.

Next, description is made on the whole configuration of the photoelectric conversion part in reference to FIG. 7.

A large number of cascade connections of the picture element photo diode PD, the monitoring photo diode MPD, the barrier gate 22, the storage part 23, the storage part clear gate 24, the shift gate 25 and the shift register 26 as described above in FIG. 8 are arranged in the transverse direction, and, for example, the number of segments of the shift registers 26 is 128. Note that as seen at the right end of the above-mentioned arrangement, the number of segments of the picture element photo diode PD, the monitoring photo diode MPD, the barrier gate 22, the storage part 23, the storage part clear gate 24 and the shift gate 25 is smaller by five in comparison with that of the shift register 26 at the right end side. In reverse, only the number of segments of the shift registers 26 is larger by five at the right end side. The reason is as follows. A capacitor $C_1$ receiving the output of the shift register 26 is formed in one-piece with the shift register 26, and specifically as shown in the conventional example of FIG. 11(a), it is formed by a junction capacitance produced between a n+region 46 formed by diffusion and a P-type region 47.

Figure 11A:
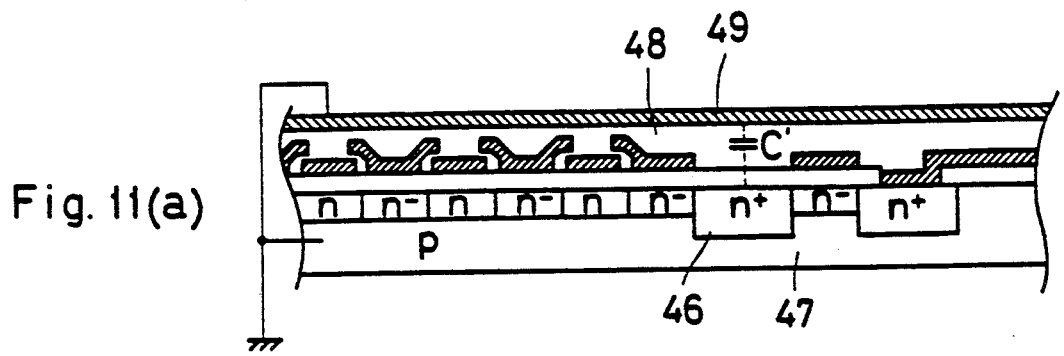
FIG. 11a-d are a view showing a structure of an output part of a shift register in FIG. 7 in comparison with the conventional example.
Figure 11B:
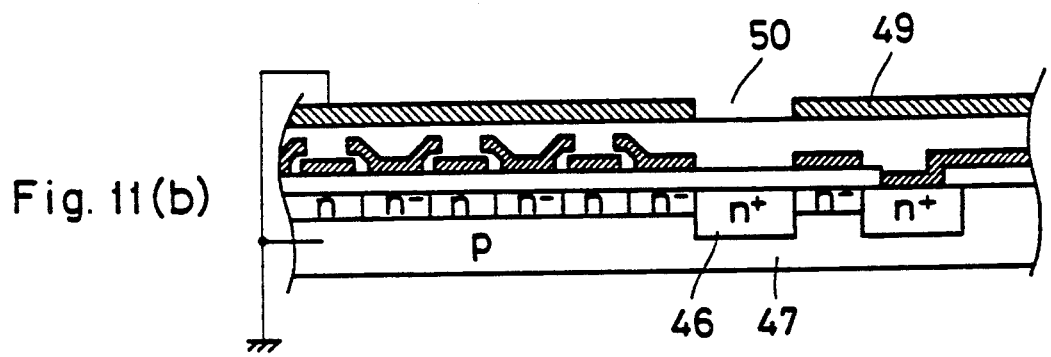
Figure 11C:
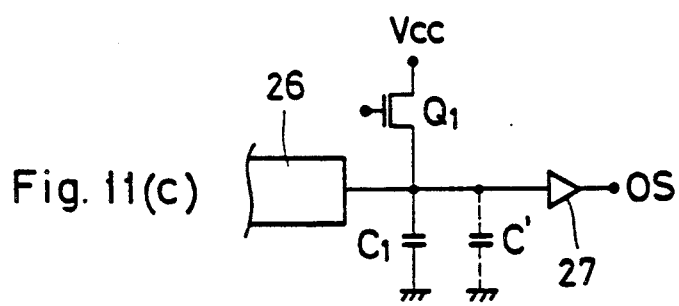
Figure 11D:
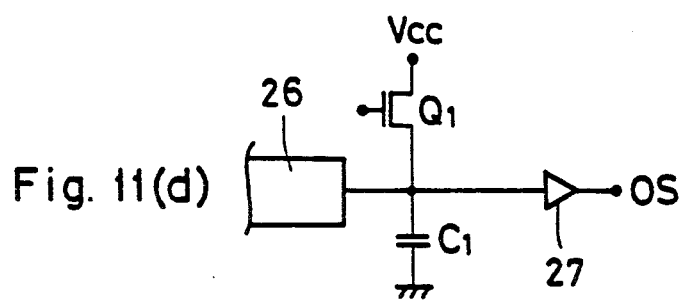

Then, a distribution capacitance C' is produced also between an aluminum film 49 for shielding light which is filmed on the surface through an insulating film 48 and the above-mentioned n+region 46. This undesirable distribution capacitance C', as shown in FIG. 11(c), works in parallel with the original capacitor $C_1$ formed by a junction capacitance to increase the output capacitance, resulting in a reduction in photo sensitivity. Also, the above-mentioned distribution capacitance C' produced between the above-mentioned aluminum film 49 for shielding light and the n+region 46 has large scattering and causes large scattering of photo sensitivity of the product, therefore being not preferable. Then, as shown in FIG. 11(b), the portion 50 of the aluminum film 49 positioned at the output stage is eliminated. This removes almost all of the above-mentioned distribution capacitance C', and the output capacitance $C_1$ is scarcely affected by it, resulting in an increase in photo sensitivity. On the other hand, light shield of the eliminated portion is performed by the field mask 9 as shown in FIG. 2. This means that the junction capacitance portion as the above-mentioned capacitor $C_1$ is disposed at the position deviating from the window of the field mask 9. This elimination is not limited to the capacitor $C_1$ installed at the output stage of the shift register 26, but the aluminum films on the tops of capacitors $C_2$–$C_6$ installed at each output stage are also eliminated.

FIG. 12 shows a schematic shape of the photoelectric conversion part 15 when this configuration is viewed from the field mask side, and numeral 51 designates a photo detector portion consisting of the photo diode array 21 and the color temperature detecting photo diodes 13 and 14, and numeral 52 designates projection of the window of the field mask 9. The above-mentioned capacitors $C_1$–$C_6$ are disposed at the position apart from the projection image of the above-mentioned window, and accordingly at the position where no light reaches. Here, the aperture areas of the capacitors $C_1$–$C_6$ are set to be equal to one another. Such a configuration enables output voltages of the capacitors $C_1$–$C_6$ to be equal for the same output from the photo detectors of the same size. Among these capacitors $C_1$–$C_6$, only the capacitor $C_1$ is located at the position apart from the segment of the shift register corresponding to the photo detector portion, and therefore the segments for connecting therebetween are required, and those segments are from a first segment to a fifth segment as shown in FIG. 7. Accordingly, these five segments function only as transfer paths of photo charges.

Since the capacitors $C_2$–$C_6$ directly input the output of the photo detector part, the extra segments as described above can be dispensed with. The output of the shift register 26 is given to the above-mentioned capacitor $C_1$ by the transfer clocks $\phi_1$ and $\phi_2$ while a transistor $Q_1$ is turned off which is turned on instantaneously by a reset signal OSRST, being outputted through the buffer 27.

In FIG. 7, five pairs of the picture element photo diodes PD and the monitoring photo diodes MPD at the right end and three pairs thereof at the left end are shielded by aluminum film. These light-shielded phot diodes generates dark charges used, for example, for dark compensation of the output of the picture element photo diode. A portion of the photo diode array 21 is assigned as a standard part $M_0$ and another portion is assigned as a reference part $M_1$. For example, the standard part $M_0$ comprises 40 combinations of the picture element photo diode and the monitoring photo diode, and the reference part $M_1$ comprises 50 combinations thereof. Note that there is no structural difference between the standard part $M_0$ and the reference part $M_1$, and they are distinguished by software processing in a system controller as described later.

For the portion considered unnecessary between the above-mentioned standard part $M_0$ and reference part $M_1$, only the shift register 26 is left intact and the picture element photo diodes, the monitoring photo diodes, the barrier gate, the storage part, the storage part clear gate and the shift gate are eliminated in the drawing. This eliminated portion is designated by symbol S. Each segment 26a corresponding to the eliminated portion S is formed in a manner that the pitch thereof is larger than that of the other portion to reduce the total charges transfer time by decreasing the number of transfer clocks required for transferring the total picture element output.

Among the monitoring photo diodes MPD, only the ones positioned at the standard part $M_0$ and the reference part $M_1$ are connected to each other to be utilized, and the ones existing at the other portion is not utilized. Note that preferably the unused monitoring photo diodes MPD are also connected to a power terminal $T_7$ to be stabilized as shown in FIG. 13. This is because when placed in the electrically floating state, they are subjected to induction from the other picture element photo diodes or induce the other picture elements, eventually affecting the other picture element photo diodes. The output of the monitoring photo diode is given to the capacitor $C_2$ once, and is retained here, being outputted as the monitor signal AGCOS through the buffer 28. To eliminate the components of this monitor signal AGCOS depending upon power variation and temperature variation, the output AGCDOS from the capacitor $C_3$ which is initialized by a transistor $Q_3$ having the same configuration as that of a transistor $Q_2$ for initializing the above-mentioned capacitor $C_2$ is provided at the same time. A photo diode $D_1$ which is light-shielded by an aluminum film and has nearly the same size as that of the monitoring photo diode MPD is connected to this capacitor $C_3$ as illustrated. The transistors $Q_2$ and $Q_3$ are turned on simultaneously during the period of application of an integration clear gate signal ICG.

Next, a pair of color temperature detecting photo diodes 13 and 14 are disposed in the standard part $M_0$ and the reference part $M_1$ respectively as illustrated, and outputs of these two photo diodes 13 and 14 are outputted respectively as the yellow color temperature detection signal OSY and the red color temperature detection signal OSR by the capacitors $C_4$ and $C_5$ initialized by transistors $Q_6$ and $Q_7$ turned on by the integration clear gate signal ICG and transistors $Q_4$ and $Q_5$ becoming conductive by a color temperature detecting gate signal PDS. Color filters (not illustrated) are installed on the surfaces of these color temperature detecting photo diodes 13 and 14. Here, an output buffer following the shift register 26, an output buffer of the red color temperature detection signal and an output buffer of the yellow color temperature detection signal are formed in the same way, and the picture element photo diode PD and the color temperature detecting photo diodes 13 and 14 are set in nearly the same size, and thereby output voltages of the yellow color temperature detection signal OSY and the red color temperature detection signal OSR are outputted as a product of the average output of the picture element photo diodes of the standard part $M_0$ and the reference part $M_1$ and the transmission factor of the above-mentioned color filter. Then, these red color temperature detection signal OSR and yellow color temperature detection signal OSY have dynamic ranges nearly equal to the output voltage of the picture element photo diode PD, and thereby can use the processing circuit of the picture element signal OS in common by time shared processing in the post-stage analog processing part. Also, the sizes of the above-mentioned color temperature detecting photo diodes 13 and 14 are the same as the size of the light-shielded picture element photo diode OPD, and therefore compensation of the dark output can also be made by taking the difference from the output voltage of that light-shielded picture element photo diode OPD. Also, in FIG. 7, the capacitor $C_6$ and a switching transistor $Q_8$ which generate an output PDDOS for eliminating power supply noise or the like of the color temperature detection signals OSY and OSR are installed.

In FIG. 7, configuration is made in a manner that the output signals OSY and OSR of the color temperature detecting photo diodes 13 and 14 are outputted through the transistors $Q_4$ and $Q_5$, the capacitors $C_4$ and $C_5$ and the buffers 29 and 30 and the like which are installed separately, but it is also possible to take out the signals utilizing the output system of the picture element output OS without separately installing such an output system.

FIG. 13 shows an embodiment following such a view point, and the output signal of the red color temperature detecting photo diode 14 is sent to the shift register 26 utilizing any one of three light-shielded picture element photo diodes OPD (second one from left in illustration) and the barrier gate, the storage part and the shift gate which are connected thereto in sequence. This output signal is sent from the shift register 26 to the capacitor $C_1$ like the output signal of normal picture element photo diode, further being outputted through the buffer 27. FIG. 13 shows a portion relating the red color temperature detecting photo diode 14 corresponding to the reference part $M_1$ as described above, and one end of the light-shielded picture element photo diode OPD second from the left end which is light-shielded by an aluminum film is formed longer than the other picture element photo diodes, being connected to the output end of the red color temperature detecting photo diode 14, and the output end of the yellow color temperature detecting photo diode 13 corresponding to the standard part $M_0$ is connected to any one of five light-shielded picture element photo diodes of the right end side in FIG. 7 which is formed longer likewise.

Next, FIG. 14 shows the above-mentioned photoelectric conversion part 15 by one block, shows details of the other portions in the photoelectric transducer 12, and discloses a system controller 53 and peripheral circuits thereof. The system controller 53 is formed by a one-chip microcomputer, and therein comprises an A/D converter part 54 converting an analog signal Vout from the above-mentioned photoelectric transducer 12 into a digital signal, a memory part 55 formed by a RAM which preliminarily inputs data such as the coefficient KL necessary for converting the detected amount of defocus into the corresponding lens shifting amount, an amount of color temperature defocus $dF_L$ and the like from a lens data output part 61 comprising a ROM provided in the photographing lens (interchangeable lens) and stores minutely digital data from the A/D converter part 54, a focusing condition detecting part 56 detecting the focusing condition based on the output of the above-mentioned memory part 55, a compensative operation part 57 calculating the amount of compensation from the above-mentioned detected focusing condition data, lens data and the like, a lens drive control part 58 which sends a signal for driving a lens to a lens drive circuit 63 based on that amount of compensation and receives data of the moving state of the lens from a motor encoder part 64, a time counting timer circuit 59 for monitoring whether or not the value of integration in the photoelectric conversion part 15 reaches a predetermined value, and a sensor control part 60 sending and receiving signals to and from the photoelectric transducer 12. In addition, numeral 65 designates a lens drive motor, and numeral 62 designates a display circuit controlled by the system controller 53. Each of the photoelectric transducer 12 and the above-mentioned system controller 53 is formed separately in one-chip, and accordingly the image sensing system is constituted with a total of two chips.

Figure 16:
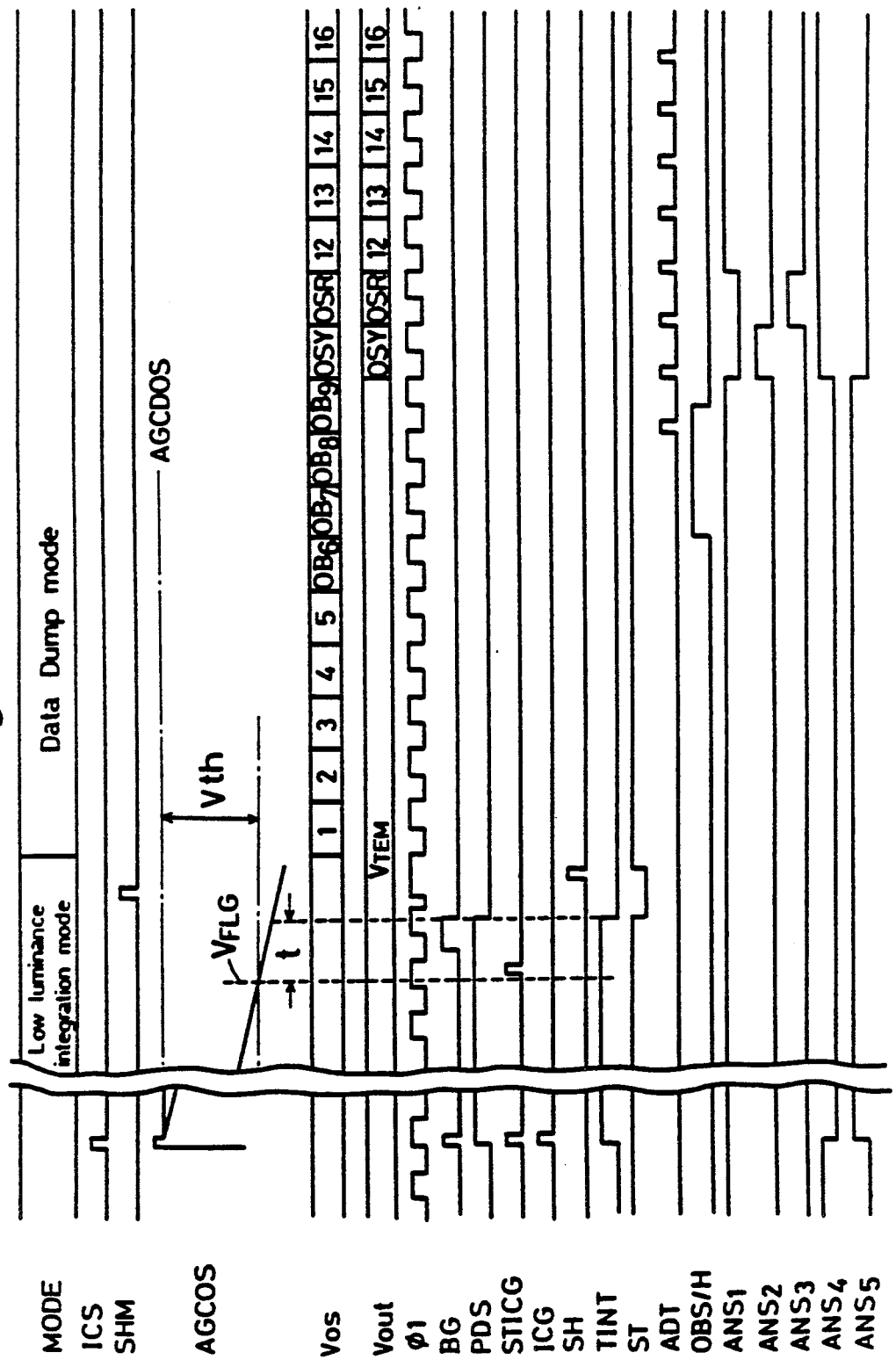
FIGS. 16a-b and 17a-b are time charts of signals of respective parts of FIG. 14 in the low luminance integration mode and in the high luminance integration mode, respectively.
Figure 16:
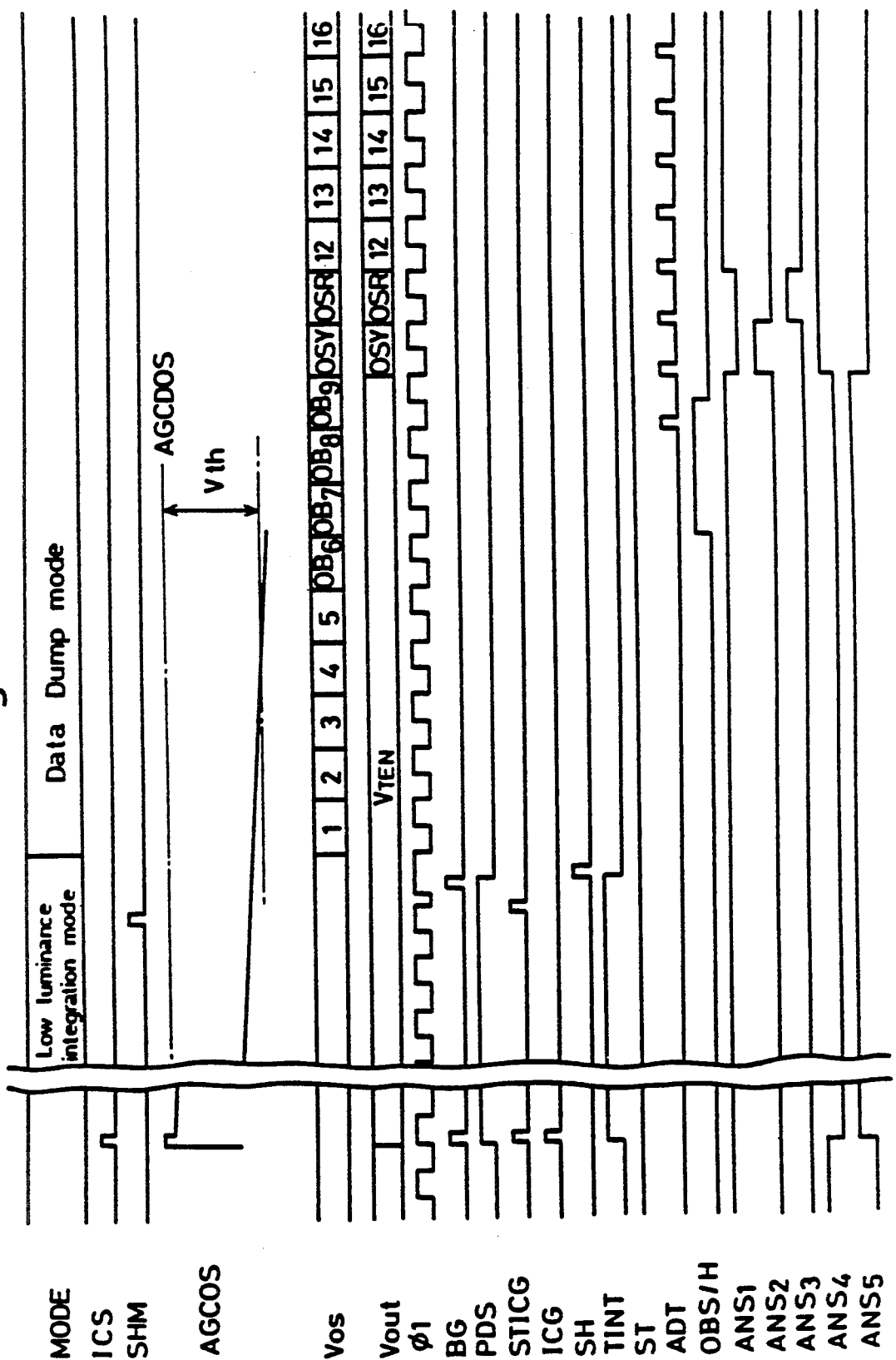

The integration time control part 17 in FIG. 6 comprises a luminance judging circuit and an integration time control circuit, and in FIG. 14, these luminance control circuit 17a and integration time control circuit 17b are shown separately. Also, a signal processing timing generating part 16B as shown in FIG. 14 is contained in the data output control part 16 as shown in FIG. 16. The I/O control part 20 in FIG. 6 is dispersed in the signal processing timing generating part 16B, an integration time control circuit 17b and the transfer clock generating part 16A in FIG. 14. The system controller 53 first gives the basic clock CP to the photoelectric transducer 12. This basic clock CP is given to the transfer clock generating part 16A and the integration time control circuit 17b. The system controller 53 also gives the mode signals $MD_1$ and $MD_2$ to the photoelectric transducer 12. The mode signal is constituted with two bits, and can express four modes; initialize mode, low luminance integration mode, high luminance integration mode and data dump mode of the photoelectric transducer 12, being sent using two lines.

In the initialize mode, the transfer clocks $\phi_1$ and $\phi_2$ are supplied in a form of high frequency from the transfer clock generating part 16A to the photoelectric conversion part 15, and charges unnecessarily stored in the shift register 26 before the transfer clocks are supplied are discharged to the capacitor $C_1$ of the output side. Charges discharged to the capacitor $C_1$ are discharged to the power supply Vcc when the transistor $Q_1$ is turned on by the reset signal OSRST. Also, in the initialize mode, initialization of the analog processing part 18 is performed.

Next, the system controller 53 first commands the low luminance integration mode, and supplies the integration clear signal ICS as shown in FIG. 16 to the integration time control circuit 17b. By an input of this integration clear signal ICS, the integration time control circuit 17b generates the integration clear gate signal ICG, the barrier gate signal BG and the storage part clear gate signal STICG which are synchronized with this integration clear signal ICS, giving them to predetermined portions of the photoelectric conversion part 15 as shown in FIG. 7, respectively. The integration clear gate signal ICG initializes the monitor output signal AGCOS, the monitor output compensation signal AGCDOS, the color temperature detection output signals OSR and OSY, and the color temperature detection compensation signal PDDOS, respectively, while the barrier gate signal BG and the storage part clear gate signal STICG initialize the picture element photo diodes PD and the storage part 23.

When the above-mentioned integration clear signal ICS disappears, the integration clear gate signal ICG, the barrier gate signal BG and the storage part clear gate signal STICG also disappear. As a result, the transistors $Q_2$ and $Q_3$ are turned off, and the capacitor $C_2$ charged to the power supply voltage Vcc at initialization starts to drop the voltage in proportion to the generated charges of the monitoring photo diode MPD, and the capacitor $C_3$ slightly drops the voltage responding to a small amount of generated charges of the light-shielded photo diode $D_1$. Also, combined with that the signal PDS is given to the transistors $Q_4$ and $Q_5$, the capacitors $C_4$ and $C_5$ drop the voltage from the power supply voltage Vcc at initialization responding to the amount of charges generated by the color temperature detecting photo diodes 13 and 14. On the other hand, the barrier gate 22 and the storage part clear gate 24 are turned off, and resultingly the picture element photo diodes PD start to generate and store photo charges in response to light irradiation, and the light-shielded photo diodes OPD start to store a small amount of dark output charges. Furthermore, the storage part 23 stores dark output charges generated by itself.

As can be guessed from FIG. 16(a), the pulse widths of the above-described signals BG, STICG and ICG are the same as the pulse width of the integration clear signal ICS. Then, in the picture element photo diode PD, the pulse width of ICS is limited by the time required for discharging all charges stored before, that is, before initialization to the power supply Vcc through the barrier gate 22, the storage part 23 and the storage part clear gate 24. Then, specifically the pulse width is selected at 50 $\mu$s-100 $\mu$s or more.

Integrating operation of the photoelectric conversion part 15 is not required to be performed so long. Instead it must be completed somewhere. This is because when the value of integration reaches a predetermined value, further successive integration is not required, and in the case where a long time is required for the value of integration to reach a predetermined level, the time from depression of the shutter release button to start the shutter release operation becomes remarkably long, and therefore it is better to end integration on half way and compensate for the shortage of the value of integration at the stage of signal processing.

Figure 15:
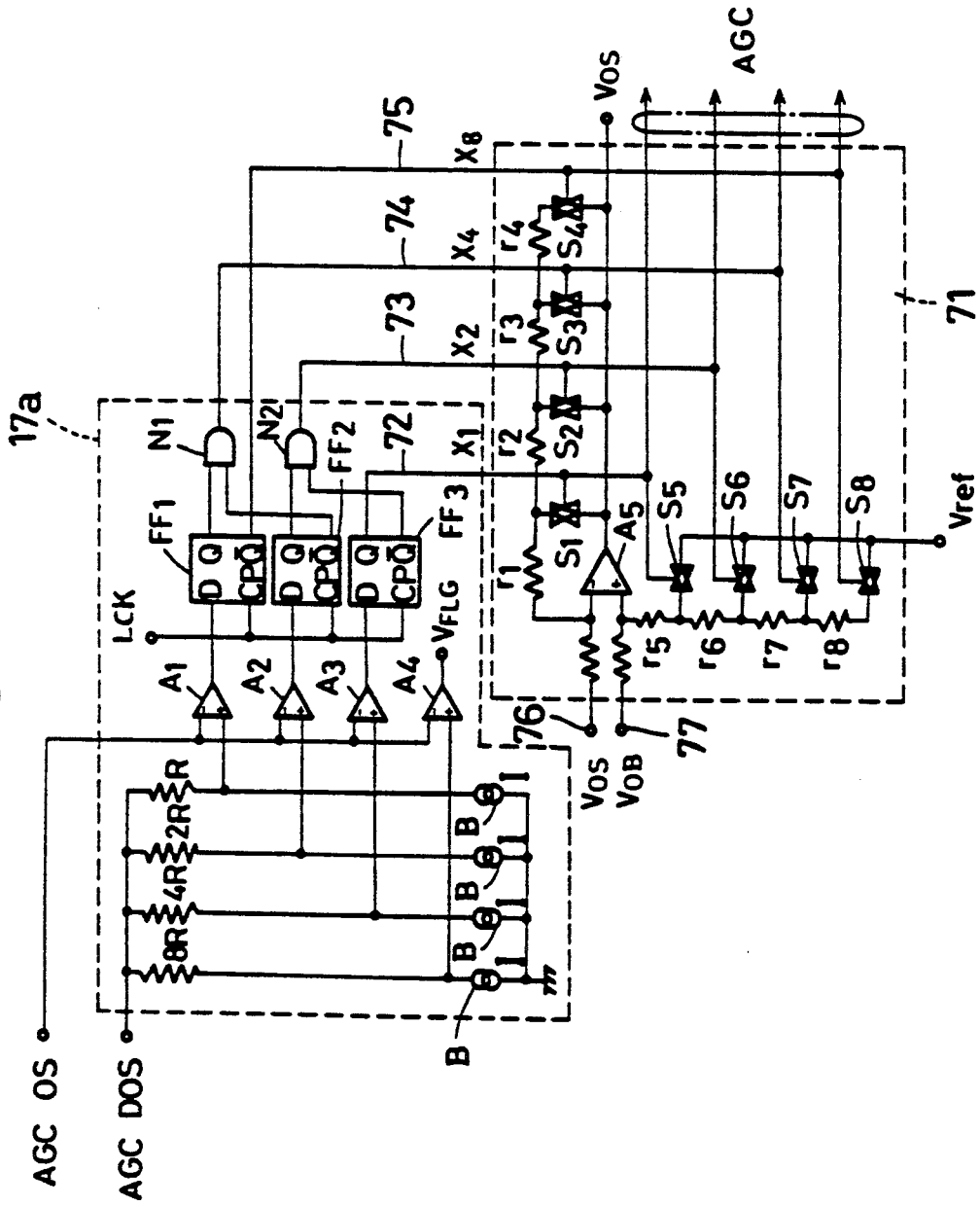
FIG. 15 is a specific circuit diagram of a part of FIG. 14.

The luminance judging circuit 17a judges the state of integration from the monitor output signal AGCOS of the monitoring photo diode MPD and the monitor output correction signal AGCDOS, and when the value of integration reaches a predetermined value, the circuit generates a designating signal $V_{FLG}$ designating that state, gives it to the above-mentioned integration time control circuit 17b, and outputs the gain control signal AGC responding to the amount of shortage of the value of integration. The gain control signal AGC is supplied to an AGC subtracting circuit 71. The AGC subtracting circuit 71 compensates for gains of the picture element output signal OS and the color temperature detection output signals OSR and OSY to be inputted. As described later, the AGC subtracting circuit 71 has also a function of compensating for the dark output of the picture element output signal OS. The AGC data is supplied also to the system controller 53. This is performed to make it possible to judge on whether or not an auxiliary lighting (not illustrated) is required based on the AGC data by the system controller 53. FIG. 15 shows a specific configuration of the above-mentioned luminance judging circuit 17a. In FIG. 15, a block as shown by a dotted line 17a is the luminance judging circuit, and the other block shown by a dotted line is the AGC subtracting circuit 71. In the luminance judging circuit 17a, the monitor output compensating signal AGCDOS is applied to plus inputs (+) of operational amplifiers $A_1$, $A_2$, $A_3$ and $A_4$ through resistors R, 2R, 4R and 8R whose resistance values are in a relation of one time, two times, three times and four times. At this time, a constant current I flows through each resistor by a constant current source B, and therefore voltage drops by the resistors are in a relation of one time, two times, three times and four times respectively. The monitor output signal AGCOS is supplied to minus input terminals (−) of the operational amplifiers $A_1$-$A_4$, and differential voltages between the signals AGCOS and AGCDOS are produced at the outputs thereof, but as shown in FIG. 7, since the capacitors $C_2$ and $C_3$, the transistors $Q_2$ and $Q_3$ and the buffers 28 and 31 are designed to be the same respectively on the same chip, the both signals AGCOS and AGCDOS have the same potential immediately after the integration clear gate signal ICG has been applied, and soon the monitor output signal AGCOS drops with generation of photo charges in the monitoring photo diodes MPD, while the monitor output compensating signal AGCDOS holds that state intact, holding the initial potential of the monitor output signal all the time. Accordingly, monitoring of the amount of storage of charges (value of integration) is made possible by taking out the difference between those signals. Also, variation in the power supply voltage can be cancelled by taking out the difference of the above-mentioned both signals, and further where the dark output increases by temperature rise, the light-shielded photo diode $D_1$ responds thereto, and therefore the component of the dark output depending on temperature change is contained in the monitor output compensating signal AGCDOS, and the differential voltage between the above-mentioned both signals becomes a correct monitoring information signal wherein temperature effect is also eliminated. When the value of integration in the picture element photo diode PD is considered to have reached a predetermined value, the monitor output signal AGCOS from the monitoring photo diode MPD drops from the initial voltage by I×8R, and therefore a designating signal $V_{FLG}$ is generated from the operational amplifier A₄. This designating signal $V_{FLG}$ is supplied to the integration time control circuit 17b. On receiving any one of the designating signal $V_{FLG}$ and a forced integration end signal SHM, the integration time control circuit 17b makes the photoelectric conversion part 15 perform integration completing operation, and generates a latch signal LCK, supplying this latch signal LCK to clock terminals CP of D flip-flops $FF_1$-$FF_3$ of the above-mentioned luminance judging circuit 17a. The D flip-flops $FF_1$-$FF_3$ are put in the latched state depending on the value of the monitor output signal AGCOS since the data terminals D are connected to the pre-stage operational amplifiers $A_1$-$A_3$. Output ends of the respective D flip-flops $FF_1$, $FF_2$ and $FF_3$ are connected to AND gates $N_1$ and $N_2$ as illustrated, and resultingly the gain control signals AGC corresponding to the amounts of compensation of a proportion of one time, two times, four times and eight times are outputted to output paths 72, 73, 74 and 75 of the luminance judging circuit 17a. In this connection, under the state that the designating signal $V_{FLG}$ is outputted within a predetermined time controlled by the system controller 53, the signal AGC is generated on the output path 72.

However, under the state that the designating signal $V_{FLG}$ is not generated within the above-mentioned predetermined time, as described later, integration is completed forcedly, and therefore the signal AGC is generated on any one of the output paths 72, 73, 74 and 75.

Description on operation in the low luminance integration mode is added using a time chart in FIG. 16(a). Integrating operation starts in the photoelectric conversion part 15 from the timing when the integration clear signal ICS has vanished, and when the monitor output signal AGCOS falls to the level corresponding to a predetermined value of integration after a while, the designating signal $V_{FLG}$ is generated from the luminance judging circuit 17a. On receiving this signal, the integration time control circuit 17b generates the storage part clear gate signal STICG to open the storage part clear gate 24, discharging a slight amount of dark charges unnecessarily stored in the storage part 23 to the power supply Vcc side. Subsequently, this storage part clear gate signal STICG vanishes and thereby the storage part clear gate 24 is closed. Soon after that the integration time control circuit 17b generates the barrier gate signal BG to open the barrier gate 22, transferring the stored charges of the picture element photo diodes PD to the storage part 23. A time t of about 50–100 μs is required from generation of the above-mentioned designating signal $V_{FLG}$ to completion of transferring operation to this storage part 23. Thus, after transferring the charges stored in each picture element photo diode PD to the storage part 23, the integration time control circuit 17b gives the integration end signal TINT to the system controller 53. In this embodiment, transition from the high level to the low level in the signal TINT expresses completion of integration. This integration end signal TINT is accepted as an interrupt signal in the system controller 53, and even while the system controller 53 is performing another processing, unless that processing is important and accordingly is a processing under interrupt inhibit, recognition processing of the integration end signal TINT is performed promptly. Also, in the case where another processing is a processing under interrupt inhibit, the processing of the above-mentioned integration end signal TINT is performed at the time of completion of that processing.

Based on this integration end signal TINT, the system controller 53 performs setting of addresses for storing picture information data of the memory part 55 based on this integration end signal TINT, thereafter supplying the shift pulse generating signal SHM to the transfer clock generating part 16A in the photoelectric transducer 12. As a result, the transfer clock generating part 16A generates the shift pulse SH, and gives this shift pulse SH to the shift gate 25 of the photoelectric conversion part 15, thereby executing transfer of charges which has been already transferred to the storage part 23 and stored up to a proper integration level. Soon after that, the system controller 53 gives a data dump mode signal as mode signals $MD$ and $MD_2$ to the photoelectric transducer 12 to set the photoelectric transducer 12 to the data dump mode. In addition, in the above-mentioned, even in the case where the system controller 53 cannot recognize the completion of integration for about 10 ms after receiving the integration end signal TINT due to the interrupt inhibit processing, the charges stored in the picture element photo diodes PD during the above-mentioned 10 ms have no effect at all on a desired amount of charges stored in the storage part 23 because in the photoelectric conversion part 15 the picture element photo diodes PD have already been cut from the storage part 23 by non-conductive state of the barrier gate 22 due to vanishment of the barrier gate signal BG, and also since the signal ST is put in the low level to raise the potential level of the storage part 23 during that period of 10 ms (detailed later), the amount of the dark charges which are generated by the storage part 23 itself and are added to the above-mentioned desired are very small, therefore having no problem. In FIG. 16(a), that generations of the shift pulse generating signal SHM and the shift pulses SH nearly synchronous with the signal SHM are a little delayed from the time when the integration end signal TINT is inverted to the low level represents that the processing of the above-mentioned integration end signal TINT is delayed in the system controller.

The above-mentioned integration time control circuit 17b also generates the color temperature detection gate signal PDS which rises in synchronism with the barrier gate signal BG and falls in synchronism with the end of a second barrier gate signal. During the period corresponding to the integration clear gate signal ICG, this color temperature detection gate signal PDS puts the switching transistors $Q_4$ and $Q_5$ between the color temperature detecting photo diodes 13 and 14 and the capacitors $C_4$ and $C_5$ in the on-state to discharge the charges unnecessarily stored before then in the color temperature detecting photo diodes 13 and 14 to the capacitors $C_4$ and $C_5$, holds the high level even after the integration clear gate signal ICG has vanished to put the transistors $Q_4$ and $Q_5$ in the on-state, and makes the respective capacitors $C_4$ and $C_5$ store charges generated in the respective color temperature detecting photo diodes 13 and 14. Then, the designating signal $V_{FLG}$ is first generated, the storage part clear gate signal STICG is generated, and then the barrier gate signal BG is generated, and at the point of fall thereof the color temperature detection gate signal PDS falls, putting the above-mentioned transistors $Q_4$ and $Q_5$ in the off-state. Thereby, the integrating operations of charges generated in the respective color temperature detecting photo diodes 13 and 14 in the above-mentioned capacitors $C_4$ and $C_5$ are completed, and the potentials at this point of completion are held as the color temperature detection output signals OSR and OSY until the next start of integration.

The above description is made on the low luminance integration mode in the case where the subject is relatively light, but the integration completing operation and the like somewhat differ in the low luminance integration mode in the case where the subject is extremely dark. FIG. 16(b) shows a time chart of each signal in this case. After the above-described integration start, the system controller 53 performs counting of integration time using the timer circuit 59 in the state of waiting reception of the integration end signal TINT. Then, in the case where integration is continued still after a lapse of 100 ms after the integration start and the integration end signal TINT is not received, the system controller 53 gives the shift pulse generating signal SHM to the photoelectric transducer 12 to forcedly complete the integration. The integration time control circuit 17b of the photoelectric transducer 12 having inputted this shift pulse generating signal SHM gives the above-described storage part clear gate signal STICG to the photoelectric conversion part 15 to discharge unnecessary charges of the storage part 23, and thereafter gives the barrier gate signal BG to transfer charges stored in the picture element photo diodes PD to the storage part 23. Thereby, the integration is completed. In addition, the reason why the signal ST is not put in the low level to raise the potential level of the storage part at this time is that the integration time of this storage part is nearly zero. Charges of each storage part 23 are shifted to the shift register 26 by the shift pulse SH given successively from the transfer clock generating part 16A, being transferred to the capacitor $C_1$ side in sequence by the transfer clocks $\phi_1$ and $\phi_2$ which are sent successively. Thus, in the forced integration completion based on the command from the system controller side, charges are not stored up to a proper integration level, and therefore the output level thereof is small, causing a reduction in S/N ratio, or becoming unsuitable for the dynamic range in the A/D converter part 54 of the system controller 53. Then, in such a case, it is desirable to make gain compensation in the analog processing part 18. Determination of this amount of compensation is made by the luminance judging circuit 17a as described previously in FIG. 15, and any one of the output paths of x1, x2, x4, x8, 72, 73, 74 and 75 is selected (goes high) responding to the amount of shortage of gain. That selected state is held until the next integration is completed and the monitor output signal is processed.

The above is the description on the integrating operation of the low luminance integration mode, but in the case where integration is started in the low luminance integration mode and the integration end signal TINT is detected within 1 ms, an excessive component of integration is increased in the low luminance integration mode and saturation takes place in the analog processing or the A/D conversion processing of the picture element output signal, and therefore the system controller 53 switches the mode signal MD$_1$ and MD$_2$ to the high luminance integration mode.

Next, description is made on the integrating operation in this high luminance integration mode in reference to a time chart in FIG. 17(a).

First, likewise in the low luminance integration mode, the system controller 53 generates the integration clear signal ICS. This pulse width is selected to be the same as that in the low luminance integration mode. Receiving this integration clear signal ICS, the integration time control circuit 17b generates the integration clear gate signal ICG, the storage part clear gate signal STICG and the barrier gate signal BG to initialize the photoelectric conversion part 15. Subsequently, with vanishment of the integration clear signal ICS, integration is started likewise in the low luminance integration mode, but since this is the high luminance integration, as shown in FIG. 17(a), the barrier gate signal BG is outputted as a high-level signal from the integration time control circuit 17b from the start to the end of integration. This means that integration is performed with the barrier gate 22 between the picture element photo diode PD and the storage part 23 kept intact in the on-state, and charges produced in the picture element photo diodes are stored in the storage part 23 from the beginning In addition, the storage part clear gate 24 is turned off during this integration. Thus, integration is started and the monitor output signal AGCOS falls from the level of the monitor output compensating signal AGCDOS equivalent to the initial potential thereof by a predetermined amount Vth ($=I \times 8R$) likewise in the low luminance integration mode, and at this point the designating signal V$_{FLG}$ is generated from the luminance judging circuit 17a, being supplied to the integration time control circuit 17b. The integration time control circuit 17b receives this designating signal V$_{FLG}$, sets the barrier gate signal BG to the low level, and puts the barrier gate 22 which has been in the on-state until that point in the off-state. Thereby, a flow of charges into the storage part 23 from the picture element photo diodes PD is stopped, and the integration end signal TINT is sent to the system controller 53. Thus, in the high luminance integration mode, transfer of charges from the picture element photo diodes PD to the storage part 23 as performed in the low luminance integration mode is not required, and the integration completing operation can be completed only by switching the barrier gate 22 from the on-state to the off-state, and therefore delay of integration completion (integration end signal TINT) to the designating signal V$_{FLG}$ can be eliminated as seen in FIG. 17(a). On the other hand, in the low luminance integration mode, as described above, a 17(a). On the other hand, time delay t of 50–100 μs (refer to FIG. 16(a)) takes place. Then, when the barrier gate 22 is put in the off-state, the potential of the storage part is raised by setting the signal ST to the low level, and thereby generation of the dark charges is reduced. The charges which are stored in the storage part whose potential has become high and are integrated up to a proper integration level in such a manner are shifted to the shift register 26 by control of the transfer clock generating part 16A which inputs the shift pulse generating signal SHM from the system controller 53 and forms the shift pulse SH and the transfer clocks $\phi_1$ and $\phi_2$, and are transferred sequentially to the output capacitor $C_1$ of the shift register 26 likewise in the low luminance integration mode. The above-mentioned signal ST goes high in synchronism with vanishment of the shift pulse SH, and thereby the charges of the storage part returns to the original state. In addition, the color temperature detection gate signal PDS controlling integration of the output of the color temperature detecting photo diodes 13 and 14 is outputted as a signal of the same value as the barrier gate signal BG here, and falls at a fall of the barrier gate signal BG, holding the outputs of the color temperature detection output signals OSR and OSY at the point of integration completion of the picture element photo diodes PD.

In addition, the operation in the case where the luminance of the subject is extremely low in the above-mentioned high luminance integration mode is shown in a time chart of FIG. 17(b). In this case, the integration end signal is not generated within a predetermined counting time by a timer circuit of the system controller 53, and therefore, likewise the case of an extremely low luminance in the low luminance integration mode, the signal SHM is generated from the system controller side before receiving the signal TINT, and thereby the integrating operation is completed. Operation of completing the integrating operation is the same as the case in FIG. 17(a).

Figure 20A:
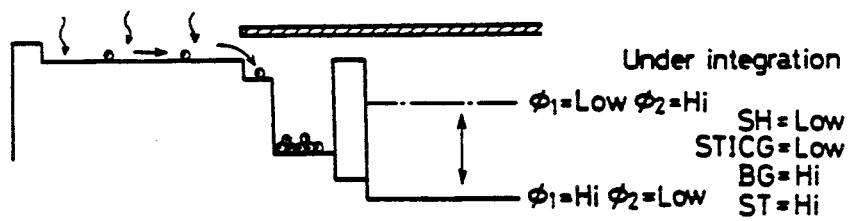
Figure 20B:
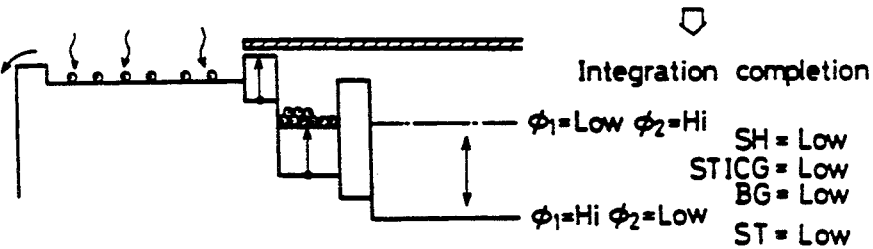
Figure 20C:
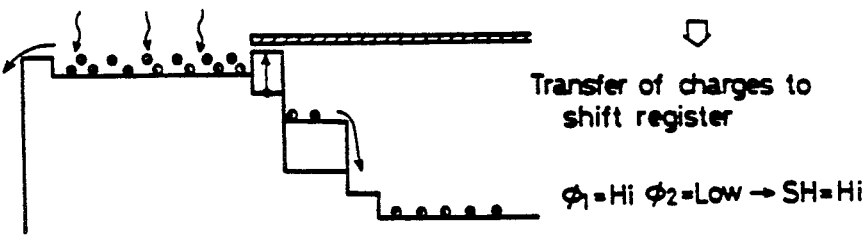

The above description is made on the integrating operation of the photoelectric conversion part 15 in each of the low luminance integration mode and the high luminance integration mode, and FIG. 19 and FIG. 20 schematically show physical operations of the picture element photo diode PD, the barrier gate 22, the storage part 23, the shift gate 25 and the shift register 26 of the photoelectric conversion part. Also, in these drawings, portions other than the picture element photo diode PD are shown by symbols of applied signals. In addition, symbol OG designates an out gate appended to the end of the picture element photo diode PD, and when required, for example, when unnecessary charges are remarkably produced in the picture element photo diode PD as shown in FIG. 20(b) and (c), the unnecessary charges can be discharged through this out gate OG. FIG. 19 expresses the case of the low luminance integration mode and FIG. 20 expresses the case of the high luminance integration mode, respectively.

In FIG. 19, (a) shows operation during integration, and (b) shows operation discharging charges of the storage part 23 to the power supply Vcc through the storage part clear gate 24 before transferring charges of the picture element photo diode PD as integration completing operation (i). FIG. 19(c) shows operation transferring charges of the picture element photo diodes to the storage part 23 as the integration completing operation (ii). FIG. 19(d) shows the state at the time of integration completion, and here the potential control signal ST of the storage part is changed from the high level to the low level, and thereby the potential level of the storage part is raised. The reason is as follows. In the state of holding charges from the picture element photo diodes PD, the dark charges in the storage part 23 itself is easier to be generated with deeper potential of the storage part 23 and the amount of stored charges is varied, and therefore generation of the dark charges in the storage part itself is suppressed by shallowing the potential. On this point, the case of the high luminance integration mode is also the same. FIG. 19(e) shows initialization, that is, clearing operation of integration.

In the high luminance integration mode, FIG. 20(a) shows operation during integration, (b) shows operation when integration is completed, and (c) shows operation of transferring charges to the shift register. Also in this case, the integration clearing operation is performed as shown in FIG. 19(e).

Figure 17:
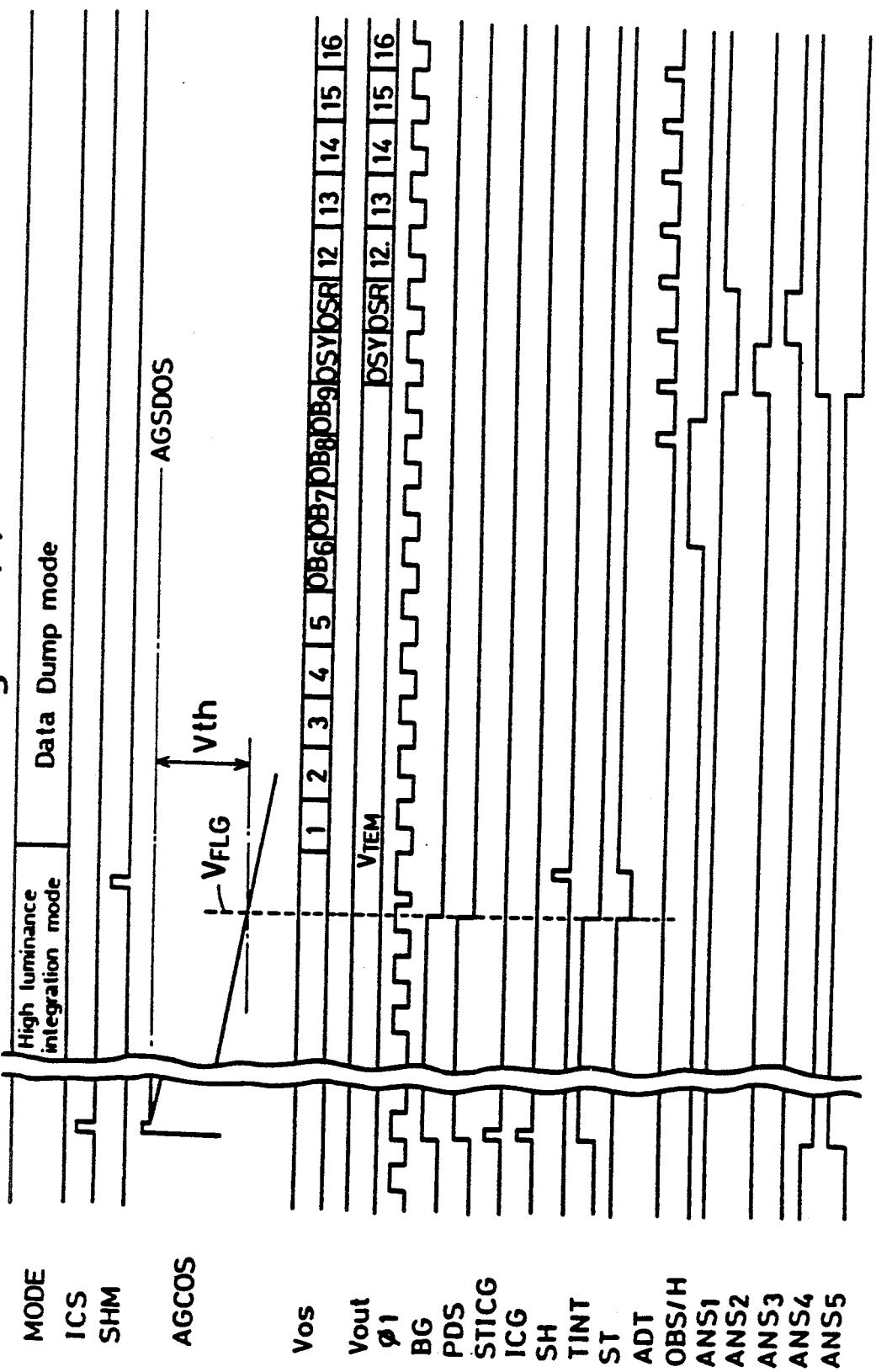
Figure 17:
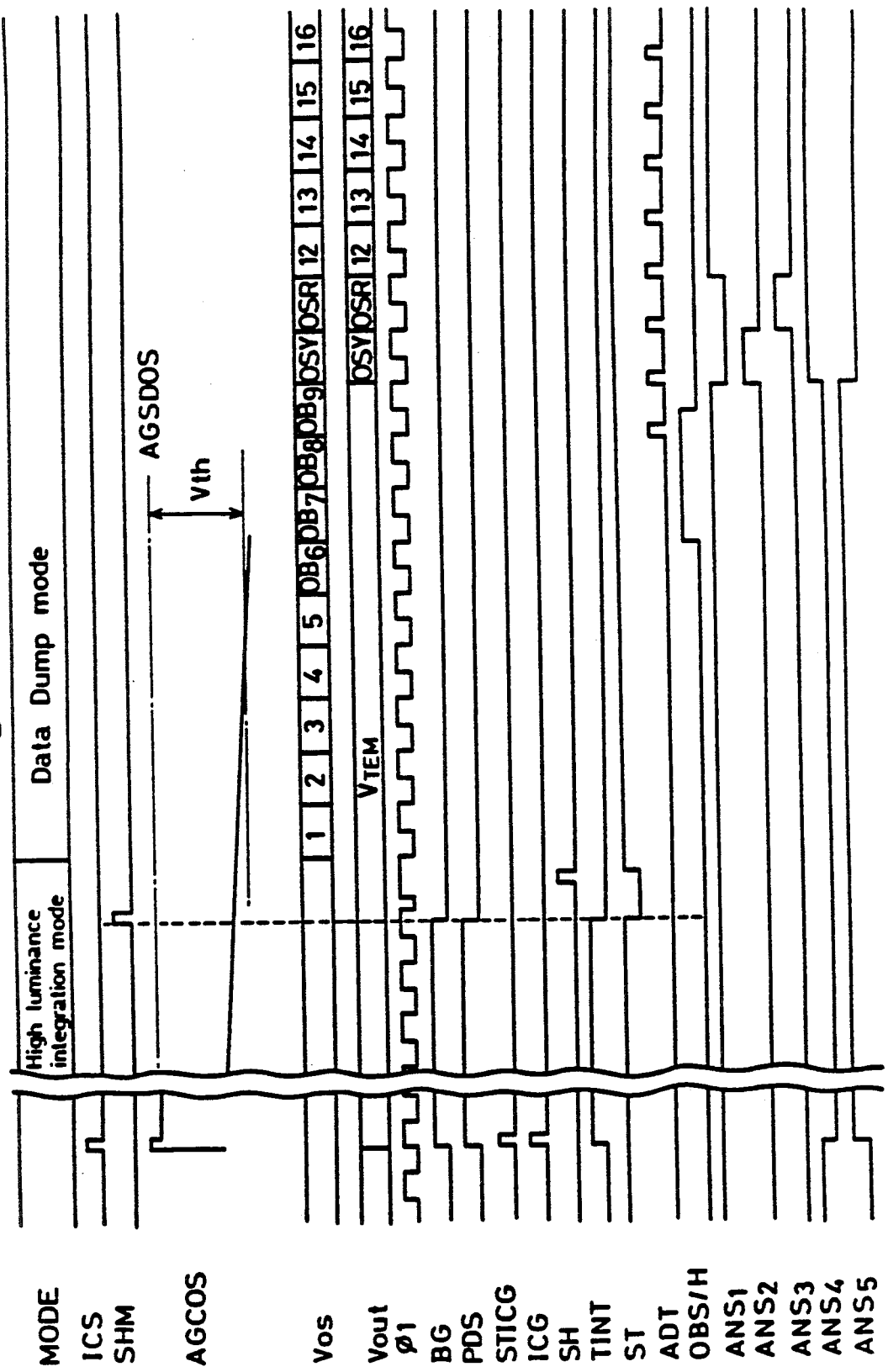

Next, description is made on the analog processing part 18 as shown in FIG. 14 in reference to time charts in FIG. 16 -FIG. 18. As shown in FIG. 7, a first segment-a fifth segment from right in the shift register 26 have no picture element photo diode corresponding thereto. Accordingly, the first five of the picture element output signal OS outputted through the buffer 27 are outputs of the register segments having no photo diode, and successively outputs of the light-shielded picture element photo diodes OPD are outputted to a sixth segment-a tenth segment, and thereafter output of the picture element photo diode in the standard part $M_O$, outputs of the register segments corresponding to an unnecessary parts, and finally outputs of the light-shielded picture element photo diodes OPD at the left end side follow in that order. The output waveform thereof is shown by OS in FIG. 18.

Initialization of the picture element output signal OS is performed by resetting the capacitor $C_1$ in FIG. 7. In this initialization, the reset pulse OSRST is applied to the gate of the transistor $Q_1$, the transistor $Q_1$ is put in the conductive state, and thereby the capacitor $C_1$ is charged up to the power supply voltage Vcc, and a signal induced by the clock field through effect of the MOS type transistor $Q_1$ is generated when that reset pulse OSRST is applied, and when this reset pulse OSRST ends, the capacitor $C_1$ is charged up to nearly the power supply voltage, indicating the original standard level. Note that this standard level varies by variation of the power supply voltage when the above-mentioned reset pulse OSRST is applied. Subsequently, the shift register 26 transfers by one phase at a fall of the transfer clock $\phi_1$, and charges stored in the next picture element photo diode flows into the capacitor $C_1$, being outputted. The amount of voltage drop at this time is a picture element output signal Vos(n) proportional to the quantity of incident light of that picture element photo diode. Subsequently, the reset pulse OSRST is applied again to the transistor $Q_1$, the capacitor $C_1$ is reset, and a picture element output signal Vos(n+1) of the next picture element photo diode is obtained by the next transfer clock $\phi_1$. The picture element output signals are thus outputted in sequence. Then, the difference between a train of picture element output signals thus outputted and a voltage $V_{RS}$ which is sampled at a timing of RSS/H in FIG. 18 and is held in a first sample hold circuit 66 is taken out by a subtracting circuit 67, and thereby the reset level of the differential output (OSdif) thereof is equalized to a constant value, and the voltage drop from that level becomes the value of picture element output signal. Generally this power supply noise eliminating method is called the double sampling system.

Subsequently, sample hold is performed by a second sample hold circuit (not illustrated) installed in the same subtracting circuit 67 using the above-mentioned differential output OSdif thus obtained. This is for securing the time of holding the input analog amount constant for the A/D conversion part 54 in the post-stage system controller 53. The picture element output signals sample-held by the above-mentioned subtracting circuit 67 become signals reduced from VosS/H in FIG. 18 by Vos(n), Vos(n+1) and Vos(n+2), respectively.

Out of the picture element output signals Vos thus processed, the dark picture element output signals outputted seventhly-ninthly are sample-held by the next third sample hold circuit 70. As shown in FIG. 16, sampling pulses at this time extract just the output signals of a seventh-a ninth light-shielded picture element photo diodes OPD light-shielded by the aluminum films out of the picture element output signals. In addition, a sixth signal is not sampled, accordingly not being used. The reason is as follows. The sixth picture element, as shown in FIG. 7, is positioned at the endmost part of the light-shielded picture element photo diode OPD, therefore being liable to be affected by external noise, and accordingly the output thereof not always becomes an accurate dark picture element output. The seventh-the ninth dark picture element outputs sampled by the above-mentioned OBS/H are to be held at least until outputs of a train of picture element photo diodes end (until a 128th segment output of the shift register is processed).

Thus, the differences between the dark picture element output $V_{OB}$ sample-held and the picture element output signals Vos outputted eleventhly and after are taken out by the next-stage AGC subtracting circuit 71, and thereby the picture element output signal Vos by only the photo charge output with the dark output eliminated can be obtained. This subtraction is performed by the AGC subtracting circuit 71 as shown previously in FIG. 15. In FIG. 15, symbol $A_5$ designates an operational amplifier taking the difference between the dark picture element output $V_{OB}$ inputted from a terminal 77 and the picture element output signal Vos inputted from a terminal 76. In addition, the amount of shortage of gain of the picture image output signal based on a forced stop of integration at low luminance is compensated by switching resistors $r_1$, $r_2$, $r_3$ and $r_4$ connected between the output end and the negative input terminal (−) of this operational amplifier $A_5$ and resistors $r_5$, $r_6$, $r_7$ and $r_8$ connected between the reference voltage Vref and the positive input terminal (+) by the above-mentioned gain control signal AGC through analog switches $S_1$–$S_8$. The signal passing through this AGC subtracting circuit 71 is outputted from the photoelectric transducer 12 to the system controller 53. For this purpose, the above-mentioned AGC subtracting circuit 71 is configured in a manner that the output level is adjusted to the dynamic range ($\frac{1}{3}$Vref $\leq$ DR $\leq$ Vref) of the A/D conversion part 54 in the system controller 53, and the dark picture element output is set to Vref, and if the picture element output Vos is increased, an output of a form of Vref −Vos can be taken out. This means that when the picture element output voltage Vos equal to the dark output voltage $V_{OB}$ inputted to the terminal 77 is inputted to the terminal 76, the output of the operational amplifier $A_5$ becomes Vref, and when the input Vos becomes lower than $V_{OB}$, the output of the operational amplifier $A_5$ becomes Vref−Vos.

On the other hand, the differences between the color temperature detection output signals OSR and OSY and the color temperature detection compensating signal PDDOS acting as the reference voltage output are taken out by a second and a third subtracting circuits 68 and 69. Furthermore, those differential outputs are supplied to the above-described AGC subtracting circuit 71 to compensate the dark output to be amplified by a proper gain and also to be adjusted to the reference voltage. At this time, timing of supply to the AGC subtracting circuit 71 is performed by control signals $ANS_1$, $ANS_2$ and $ANS_3$ as shown in FIG. 16 and FIG. 17 which are given from the signal processing timing generating part 16B for analog switches $AN_1$, $AN_2$ and $AN_3$ following the subtracting circuits 67, 68 and 69. As a result, in this embodiment, as shown in the picture element output signal Vos in FIG. 16 and FIG. 17, during output of the tenth picture element output signal immediately after the end of sampling of the dark output, in place of it, the yellow color temperature detection signal OSY, and during output of the eleventh picture element output signal, in place of it, the red color temperature detection signal OSR are supplied to the AGC subtracting circuit 71, respectively. In addition, in the case where, in the photoelectric conversion part 15, the color temperature detection signals OSR and OSY are outputted by the same path as that of normal picture element output signal utilizing the light-shielded picture element photo diodes OPD as shown in FIG. 13 without using the method of outputting them using output buffers separately installed, the signals are outputted as a tenth and a 127th picture element output signals from the buffer 27. Then, noise components of these outputs are eliminated by the above-described double sampling system, and the dark output is compensated by taking the difference from the value of dark output sampled signal, and thereafter the outputs are supplied to the above-described AGC subtracting circuit 71. In this case, the second and the third subtracting circuits 68 and 69 and the analog switches $AN_1$, $AN_2$ and $AN_3$ can be dispensed with.

Figure 21:
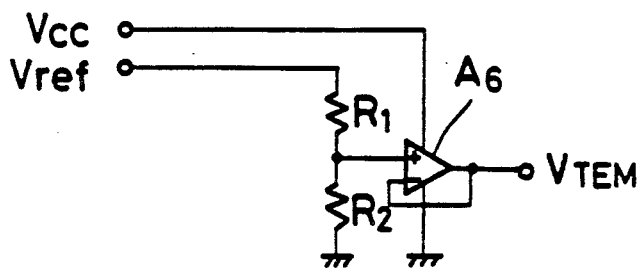
FIG. 21 is a specific circuit diagram of a temperature detection part in FIG. 14.
Figure 22:
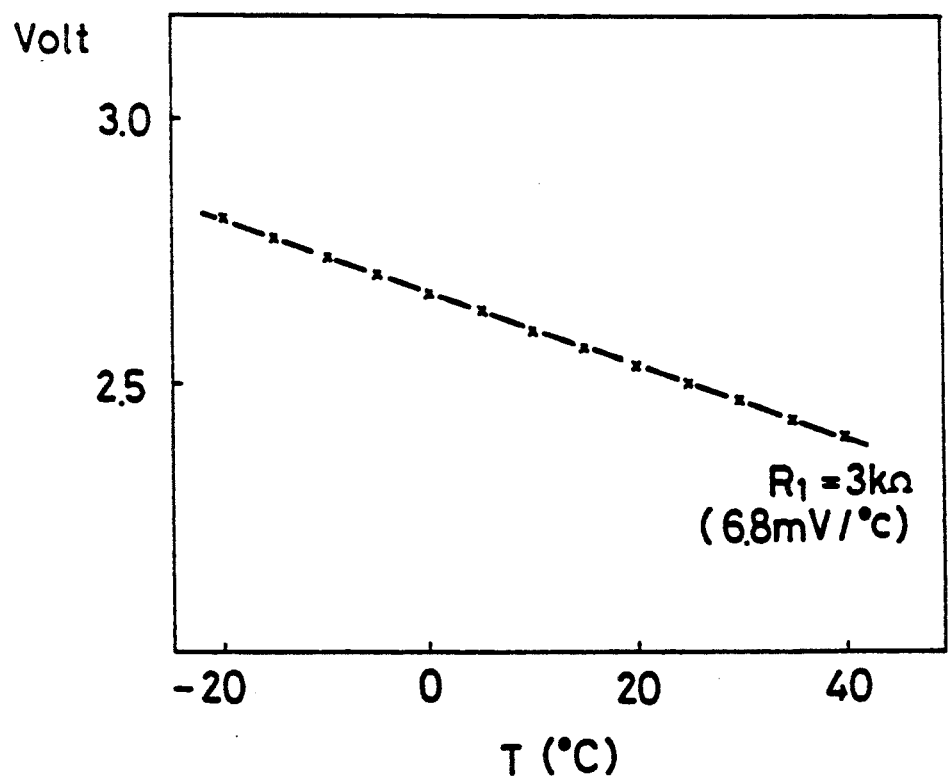
FIG. 22 is a graph of output characteristic of the same circuit.

After having finished description on the analog processing part 18, next, description is made on the temperature detecting part 19. In the automatic focus condition detecting system as shown in FIG. 2, for example, acrylic resin material portion of the lens holder 9, the substrate 5 holding the image re-forming lenses 4a and 4b and the like are expanded by temperature, varying delicately dimensions of predetermined portions. This causes an automatic focus condition detecting error due to temperature. From such a point, the temperature detecting part 19 is installed to make temperature compensation electrically, and in this temperature detecting part 19, as shown in FIG. 21, resistors $R_1$ and $R_2$ are connected in series between the above-mentioned reference voltage Vref having a predetermined potential lower than the power supply Vcc and ground, and the connecting point of the resistors $R_1$ and $R_2$ is connected to the positive input terminal (+) of an operational amplifier $A_6$. The negative input terminal (−) and the output end are connected directly to each other. Then, the resistor $R_1$ is an ion implantation type resistor having a temperature coefficient of $\beta R_1 = 5000$ ppm, and the resistor $R_2$ is a polysilicon resistor having a temperature coefficient of $\beta R_2 = 500$ ppm, and the resistance values at 25° C. of $R_1$ and $R_2$ are the same 10 KΩ. Then, FIG. 21 shows output characteristics of the temperature detecting part in the case where the power supply voltage Vcc is 13 V and the reference voltage Vref is 5 V in the construction shown in FIG. 21. The detection output is represented by the voltage across the both terminals of the resistor $R_1$.

In time charts in FIG. 16 and FIG. 17, the first through the ninth outputs out of the picture element output signals Vos outputted from the AGC subtracting circuit 71 are not required to be given to the system controller 53 as output signals of the photoelectric transducer 12. Signals to be supplied to the system controller 53 are the yellow color temperature detection signals OSY positioned tenthly and after. Accordingly, the first through the ninth outputs give the above-mentioned temperature detection signals $V_{TEM}$ to the system controller 53 through the same output line in place of the picture element output signals. For this purpose, analog switches $AN_4$ and $AN_5$ are installed respectively at this side of connection point (h) of the AGC subtracting circuit 71 and the temperature detecting circuit 19, and gate signals $ANS_4$ and $ANS_5$ as shown in FIG. 16 and FIG. 17 respectively are supplied from a signal processing timing generating part 16B to these analog switches $AN_4$ and $AN_5$.

Figure 26A:
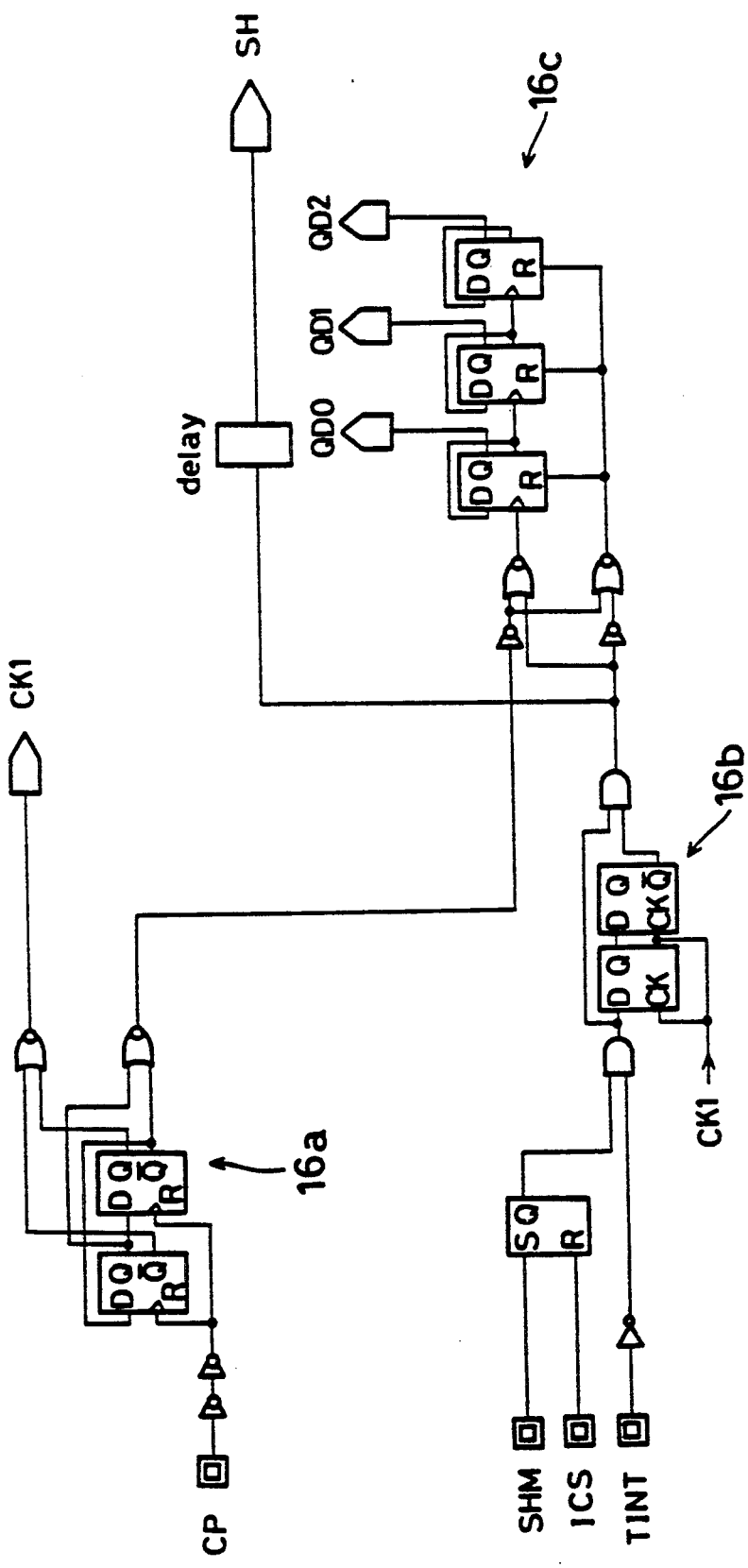
FIG. 26a-b are a specific circuit diagram of a transfer clock generation part.
Figure 26B:
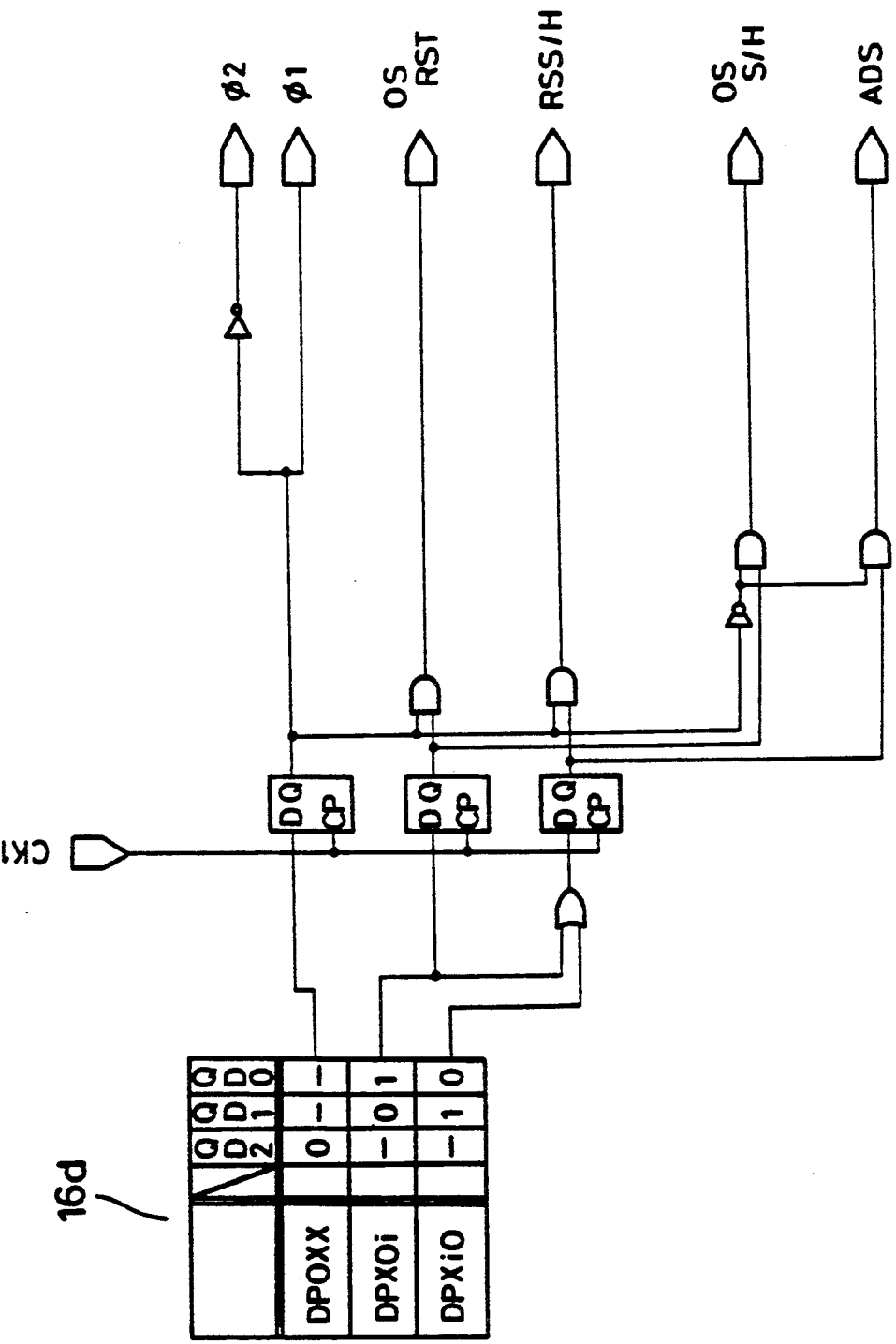

Next, FIG. 26(a) and FIG. 26(b) show a specific configuration of the transfer clock generating part 16A. Among them, FIG. 26(a) shows a portion forming the shift pulse SH, and FIG. 26(b) shows a portion generating the transfer clocks $\phi_1$ and $\phi_2$, the signals OSRST, RSS/H, OSS/H, ADS and the like. In FIG. 26(a), numeral 16a designates a first frequency divider dividing the frequency of the basic clock CP from the system controller 53, and the output of the first frequency divider 16a is further divided by a second frequency divider 16c reset by the output of a shift pulse forming part 16b forming the shift pulse SH by logic of SHM, ICS and TINT to generate signals QD0, QD1 and QD2. These outputs are decoded by a decoder part 16d in FIG. 26(b), and the clocks $\phi_1$ and $\phi_2$, the signal OSRST and the like are formed through a circuit following the decoder part 16d.

Figure 27:
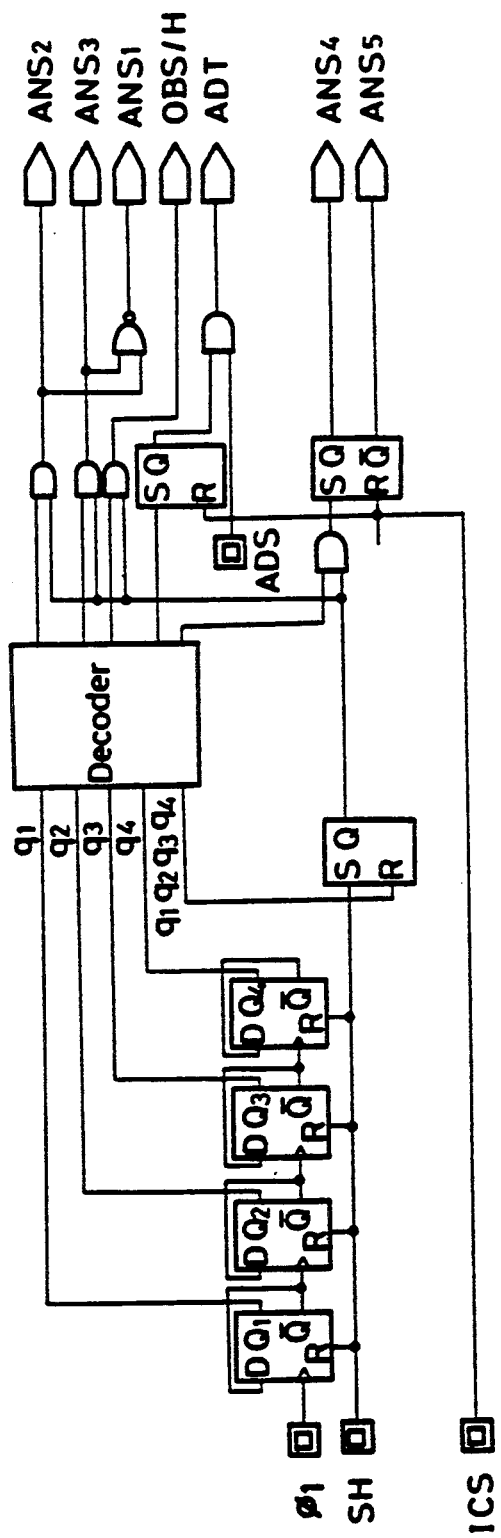
FIG. 27 is a specific circuit diagram of a signal processing timing generation part in FIG. 14.

FIG. 27 shows a specific example of the signal processing timing generating part 16B, which inputs $\phi_1$, SH and ICS and generates $ANS_1$-$ANS_5$, OBS/H and ADT. Symbol ADT designates the control signal for triggering A/D conversion of the system controller 53.

Figure 23:
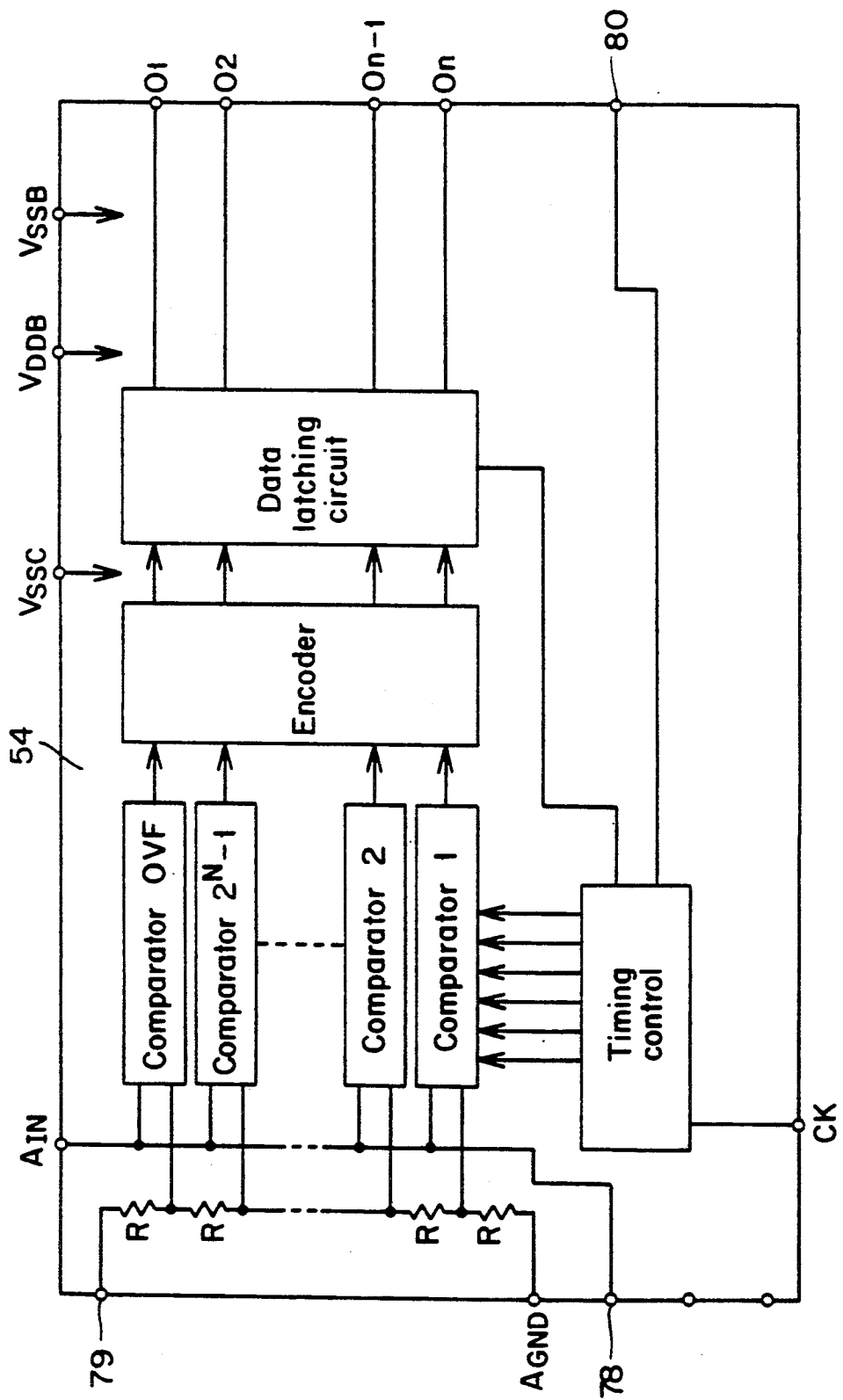
FIG. 23 is a circuit configuration view of an A-D conversion part of a system controller as shown in FIG. 14.

Next, description is made on the system controller 53. The A/D conversion part 54 in the system controller 53 is formed as shown in FIG. 23, and the picture element output signal Vout from the above-described photoelectric transducer 12 is inputted to a terminal 78, the reference voltage Vref is inputted to a terminal 79, and the signal ADT is inputted to a terminal 80. Then, A/D conversion output is lead out from terminals $O_1, O_2 \ldots O_n$.

Figure 24:
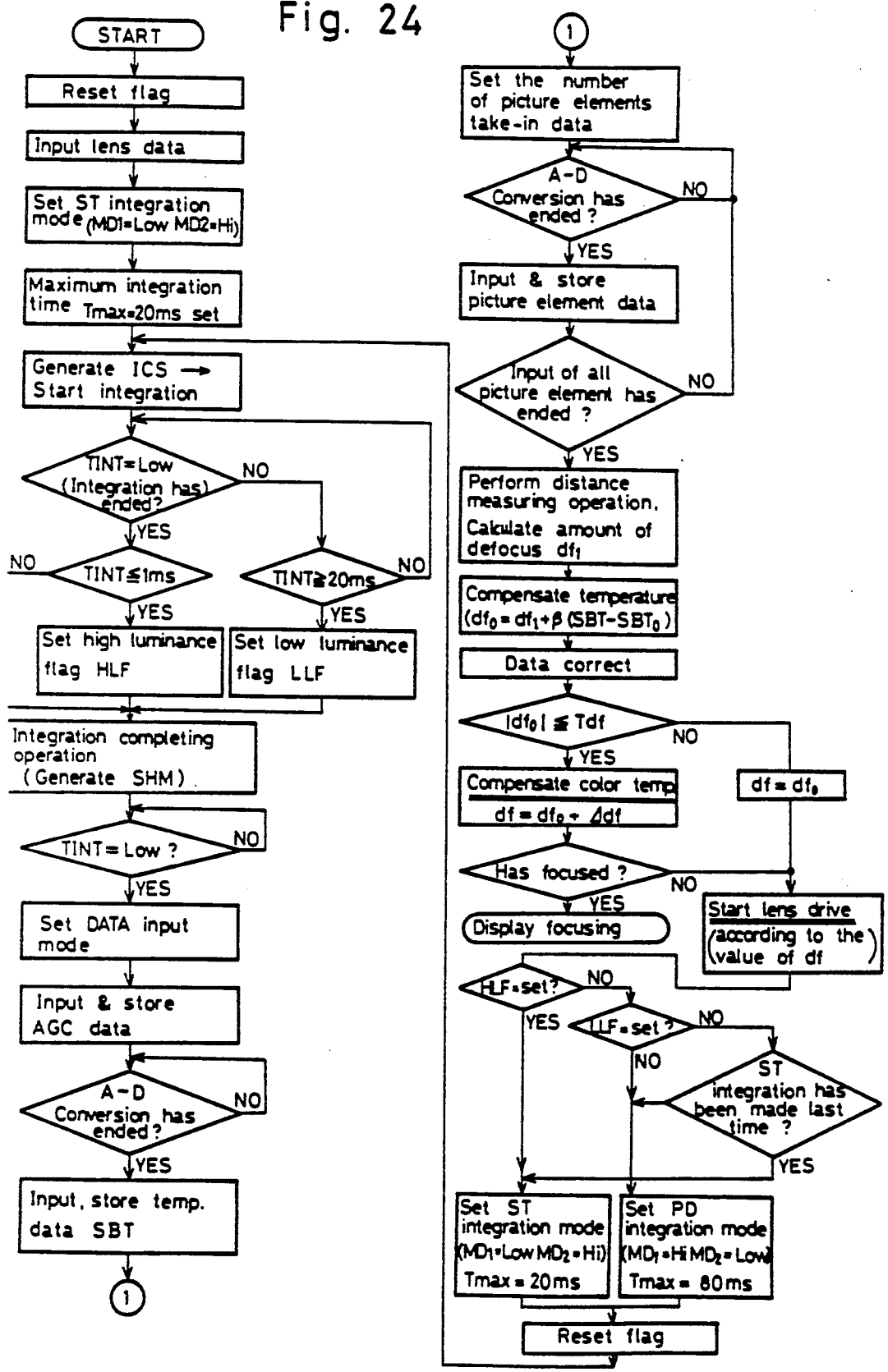
FIG. 24 is a flow chart showing operation of the system controller.

The system controller 53 detects the color temperature of the subject by calculating the ratio R of digital values $V_{OSR}$ to $V_{OSY}$ of the color temperature detection signals OSR and OSY thus A/D-converted, making compensation responding to that color temperature, and FIG. 24 shows a flow chart thereof. FIG. 24 shows a flow of the whole of the automatic focusing operation, and FIG. 25(a), (b), (c) and (d) particularly show a flow of color temperature compensation in the whole flow.

First, general description is made on the automatic focusing operation using FIG. 24. When the automatic focusing operation is started by depressing a shutter button in a camera, the system controller 53 resets a flag, and inputs lens data containing color temperature compensation data from the lens data outputting part 61. Such lens data include the above color temperature compensation data, a plurality of aberrations compensation data, infrared chromatic aberration compensation data, in addition to a plurality of data disclosed in U.S. Pat. No. 4,550,993. The color temperature compensation data contains data indicating whether or not the color temperature compensation is necessary, and data indicating amounts $\Delta dF_1$, $\Delta dF_2$, as explained later. The system controller 53 sets the high luminance integration mode ST making the storage part perform storage (signals MD1=low level, MD2=high level) as an integration mode, and sets the maximum integration time to 20 msec. Then, it generates the integration clear signal ICS to start integration. At this time, integrations of the color temperature detecting photo diodes 13 and 14 are executed simultaneously. Then, the integration end signal TINT showing completion of integration is waited to go low, and when it goes low, the integration is assumed to be completed, and the time required for it is judged. When that time is 1 msec or less, a high luminance flag HLF is set to set the next integration mode to the high luminance integration mode (ST mode), when the time is 1 msec-20 msec, the next integration mode is held the same as this time, and when the integration end signal TINT does not go low within 20 msec, a low luminance flag LLF is set to set the next integration mode to a low luminance integration mode (PD mode) for performing integration to the photo detector part. Then, in any case, the signal SHM is outputted to indicate the integration completing operation, waiting for the integration end signal TINT to go low. Only in the case where integration does not end within 20 msec in the low luminance integration mode, the integration end signal is waited to go low, and in any case other than this, the signal has already gone low. In addition, the picture element data is sent to the shift register by the shift pulse in a hardware manner. Then, if the integration end signal TINT is low, the system controller 53 sets the data input mode, inputting the AGC data of digital signal. Subsequently, the temperature data is inputted, and A/D conversion for this analog data is started by a pulse of the signal ADT, and this A/D conversion is waited to end.

A temperature data SBT is inputted at the time of end of A/D conversion, being stored in a predetermined register. As described above, this temperature data input is made at timing (refer to the time chart) of the ninth data input o the shift register 26 (data of the shift register is not inputted).

Next, the system controller 53 sets the number of picture elements of taken-in data including the number of color temperature detecting photo diodes and the number of picture element output signals, performs A/D conversion of the analog signal Vos to be inputted, stores data in an inner memory every time an interrupt signal is generated by this completion, and repeats this procedure by the number set as mentioned above. Thus, digital signals corresponding to the respective images in the standard part $M_0$ and the reference part $M_1$ which are stored in the memory 55 are used for calculating an amount of defocus $df_1$ by evaluating the image interval between the both parts $M_0$ and $M_1$ using correlative operation as disclosed by the present patent applicant in the Japanese Patent Laid-Open No. 247211/1985. After the calculation of $df_l$, temperature compensation based on the output from the temperature detecting part 19 is also made. Then, symbol $\beta$ is compensating coefficient of temperature of the camera itself, symbol SBT is temperature information, and symbol $SBT_0$ is basic temperature information at 25° C. Next, the temperature compensated amount of defocus $df_0$ is further compensated by the aberrations compensation data, especially by the chromatic aberration compensation data, and by the infrared chromatic aberration data if infrared light is used for auxiliary illumination, as disclosed in details in U.S. Pat. Nos. 4,511,232 and 4,560,267, respectively. Thus compensated amount of defocus is represented as $dF_0$. The amount of defocus $df_0$ undergoing this compensation is set so as to be a true value where the subject is illuminated by sun light. In the case where this amount of defocus $df_0$ is larger than a predetermined value Tdf (=2-3 mm), the value of color temperature compensation is not so large (about 100 -200 $\mu$m or less), and therefore the value of compensation itself has not large effect, and in the case where the compensated amount of defocus of the predetermined value Tdf or less is detected when lens drive is performed and remeasurement is made, a value of color temperature compensation Δdf is to be added. After the value of color temperature compensation Δdf has been added in such a manner, judgement of focusing condition is made, and when the result falls within a range of in-focus condition, display of in-focus condition is performed, and when the judgement is made to be defocus condition, the photographing lens is shifted according to a lens shifting amount calculated by a product of the above-described coefficient KL and the detected amount of defocus which is the amount of defocus $df_0$ added by the value of color temperature compensation Δdf, the integration mode is set, and then a routine consisting of a step of integration start by generation of ICS and the following steps is repeated.

Here, additional description is made on inside operation of color temperature compensation.

Figure 25A:
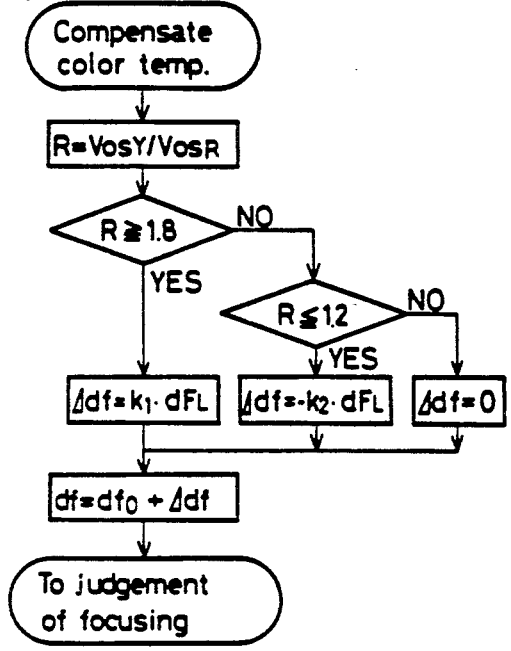
FIGS. 25a-d are a flow chart showing the detail of a part of the system controller in FIG. 24.

As described previously, a color temperature compensation data $dF_L$ of lens is inputted at the top portion of the flow chart. For this value, for example, the amounts of chromatic aberration in the case with 800 nm monochromatic light source with respect to the case with 550 nm (day light) for respective lenses are stored in a memory. On the other hand, the output signals OSR and OSY of the color temperature detecting photo diodes which have been integration-controlled simultaneously with each picture element photo diode and have undergone analog processing are digitalized by the A/D conversion part 54 of the system controller 53, being stored in the memory 55 as $V_{OSR}$ and $V_{OSY}$. As shown in FIG. 25(a), the system controller 53 calculates a ratio R of $V_{OSR}$ to $V_{OSY}$. When this ratio R is a predetermined value, for example, 1.8 or more, the incident light from the subject has a large amount of long-wavelength components, and is judged that the color temperature is low, and the color temperature compensation data $dF_L$ is multiplied by a predetermined coefficient $K_1$ ($0 \leq K_1 \leq 1$) to determine the amount of compensation of color temperature Δdf. Also, in reverse, when the radio R is 1.2 or less, the incident light from the subject has a large amount of short-wavelength components, and is judged that the color temperature is low, and the color temperature compensation data $dF_L$ is multiplied by a predetermined coefficient $-K_2$ ($0 \leq K_2 \leq 1$) to determine the amount of compensation of color temperature Δdf. When the ratio R falls between 1.2 and 1.8, the incident light from the subject is integrated by light whose components are close to day light, and no compensation of color temperature is required, and the amount of compensation of color temperature Δdf is set to 0. Thus, the true detected amount of defocus df is calculated by adding the amount of compensation of color temperature Δdf determined respectively by the light from the subject to the amount of defocus $df_0$.

Figure 25C:
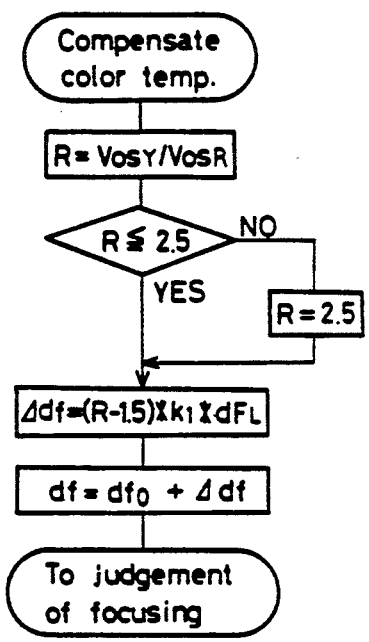
Figure 25B:
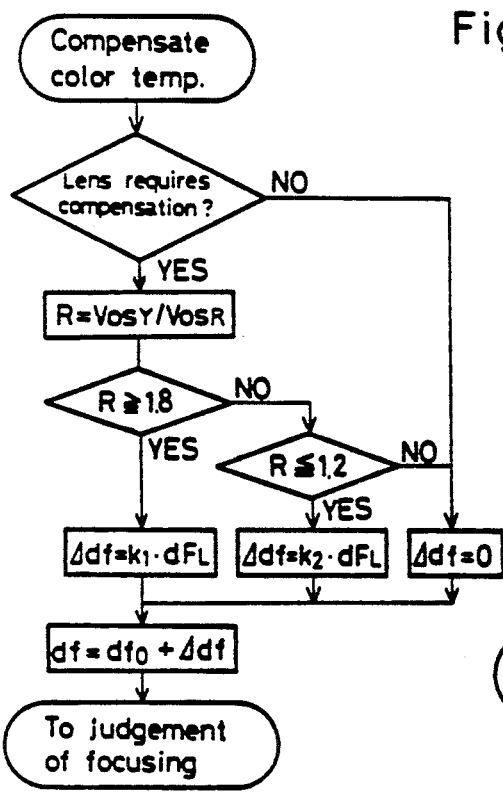

Compensation of color temperature is made in such a manner, but as another method, necessity or non-necessity of compensation of color temperature is given as lens data responding to the kind of lens, and judgement on whether or not compensation of color temperature is to be made at first as shown in a flow in FIG. 25(b), and thereby when no compensation of color temperature is required, processing can be made faster without going through an extra flow. Also, FIG. 25(c) shows a flow wherein the amount of compensation for the value of R is determined continuously instead of determining the amount of compensation in a dispersed fashion as shown in FIG. 25(a) and (b). Here, the ratio has a possibility of showing infinity for the subject having single-short-wavelength component, while in an optical system, chromatic aberration has naturally a finite value as long as the light is visible one. To accommodate for this situation, in the case of $R \geq 2.5$, the value of R is limited to 2.5, and the amount of compensation thereof is determined by a product of color temperature of defocus the predetermined condition $K_1$, and the value subtracted a standard value 1.5 from the ratio R.

Figure 25D:
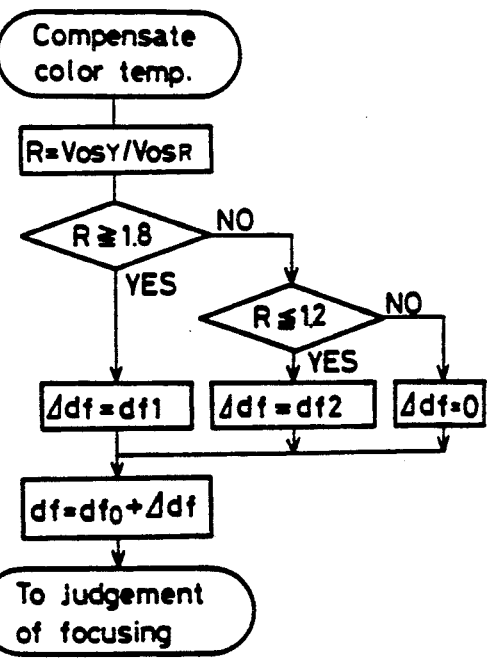

Next, in the case where determination is made in a dispersed fashion as shown in FIG. 25(a), when individual lenses can have the value of amount of compensation Δdf, as shown in FIG. 25(d), the amount of compensation Δdf becomes $df_1$ in the case of $R \geq 1.8$ and $df_2$ in the case of $R \leq 1.2$ which are given to individual lens.

In any case, in the above-mentioned embodiment, color temperatures by the long-wavelength components and the short-wavelength components within visible light are detected and compensated and therefore precision of detection of focusing is enhanced.

What is claimed is:

1. A solid state image device comprising:
   first light receiving means for receiving light and for outputting a first electric signal;
   second light receiving means being made of a same material as said first light receiving means and cutting off light to output a second electric signal;
   shift register for inputting the first and second electric signals respectively and shifting and outputting the electric signals in synchronization with a clock signal;
   capacitor connected to an output terminal of said shift register;
   reset means for resetting said capacitor each time the electric signals are shifted;
   first sample hold means for sampling and holding a voltage of the reset capacitor;
   first subtracting means for subtracting the held voltage and a voltage of said capacitor after reset;
   second sample hold means for sampling and holding a voltage corresponding to said second light receiving means outputted from said first subtracting means; and
   second subtracting means for subtracting the held voltage of said second sample hold means and a voltage corresponding to said first light receiving means outputted from said first subtracting means.

2. A solid state image device according to claim 1, wherein the solid state image device is composed of one chip.

* * * * *